US012635325B2

(12) United States Patent
Hosokawa et al.

(10) Patent No.: US 12,635,325 B2
(45) Date of Patent: May 19, 2026

(54) WIRING SUBSTRATE, LIGHT-EMITTING DEVICE, AND MANUFACTURING METHODS THEREOF

(71) Applicant: NICHIA CORPORATION, Anan (JP)

(72) Inventors: Atsushi Hosokawa, Tokushima (JP); Masaaki Katsumata, Anan (JP)

(73) Assignee: NICHIA CORPORATION, Anan (JP)

( * ) Notice: Subject to any disclaimer, the term of this patent is extended or adjusted under 35 U.S.C. 154(b) by 360 days.

(21) Appl. No.: 18/360,076

(22) Filed: Jul. 27, 2023

(65) Prior Publication Data

US 2024/0038957 A1 Feb. 1, 2024

(30) Foreign Application Priority Data

Aug. 1, 2022 (JP) ................................. 2022-122923

(51) Int. Cl.
| | |
|---|---|
| *H10H 20/857* | (2025.01) |
| *H01L 25/075* | (2006.01) |
| *H10H 20/01* | (2025.01) |
| *H10H 29/14* | (2025.01) |

(52) U.S. Cl.
CPC ....... *H10H 20/857* (2025.01); *H01L 25/0753* (2013.01); *H10H 29/142* (2025.01); *H10H 20/0364* (2025.01)

(58) Field of Classification Search
CPC .............. H01L 25/0753; H10H 29/142; H10H 20/0364; H10H 20/857; H05K 1/0274; H05K 1/181; H05K 2201/2054; H05K 3/1258; H05K 1/0306; H05K 1/092; H05K 2201/10106
See application file for complete search history.

(56) References Cited

U.S. PATENT DOCUMENTS

| | | | |
|---|---|---|---|
| 5,909,266 A | 6/1999 | Matsuo et al. | |
| 2004/0011555 A1* | 1/2004 | Chiu .................... | H05K 3/4647 |
| | | | 174/256 |
| 2004/0151893 A1 | 8/2004 | Kydd et al. | |
| 2010/0186999 A1 | 7/2010 | Kuramoto et al. | |
| 2018/0053715 A1* | 2/2018 | Ishihara ........... | H01L 23/49822 |
| 2018/0054900 A1 | 2/2018 | Ueda et al. | |
| 2018/0132354 A1* | 5/2018 | Voraberger ......... | H01L 21/4846 |
| 2020/0253037 A1* | 8/2020 | Marin .................. | H05K 1/0228 |

(Continued)

FOREIGN PATENT DOCUMENTS

| | | |
|---|---|---|
| JP | S63-047994 A | 2/1988 |
| JP | H08-204333 A | 8/1996 |

(Continued)

*Primary Examiner* — Victor A Mandala

(74) *Attorney, Agent, or Firm* — Foley & Lardner LLP

(57) ABSTRACT

A wiring substrate includes: a base body having an insulating property and including a first surface and a second surface on a side opposite the first surface; a resist portion covering at least part of the first surface and at least a part of the second surface of the base body and including a hole portion having a predetermined pattern; and a wiring line disposed in the hole portion of the resist portion so as to be in contact with the base body. In a cross-sectional view in a thickness direction of the base body, a length of an exposed surface of the wiring line exposed from the resist portion is less than a length of a contact surface of the wiring line in contact with the base body.

18 Claims, 29 Drawing Sheets

(56) References Cited

U.S. PATENT DOCUMENTS

| | | | |
|---|---|---|---|
| 2021/0247052 A1 | 8/2021 | Nakabayashi et al. | |
| 2021/0273036 A1* | 9/2021 | Marin | H05K 1/181 |
| 2021/0296230 A1* | 9/2021 | Huang | H01L 21/4857 |
| 2022/0053647 A1* | 2/2022 | Ejiri | C22C 13/00 |
| 2022/0093520 A1* | 3/2022 | Ecton | H01L 23/5385 |
| 2022/0181256 A1* | 6/2022 | Gomes | H01L 25/18 |
| 2022/0181313 A1* | 6/2022 | Gomes | H01L 24/16 |
| 2023/0168554 A1* | 6/2023 | Ito | G09F 9/40 |
| | | | 349/46 |
| 2023/0215794 A1* | 7/2023 | Hong | H01L 23/49838 |
| | | | 257/676 |

FOREIGN PATENT DOCUMENTS

| | | |
|---|---|---|
| JP | H09-046022 A | 2/1997 |
| JP | H11-251472 A | 9/1999 |
| JP | 2002-232152 A | 8/2002 |
| JP | 2002-258236 A | 9/2002 |
| JP | 2002-353595 A | 12/2002 |
| JP | 2003-017832 A | 1/2003 |
| JP | 2003-100146 A | 4/2003 |
| JP | 2004-079797 A | 3/2004 |
| JP | 2004-172283 A | 6/2004 |
| JP | 2004-335774 A | 11/2004 |
| JP | 2004-534362 A | 11/2004 |
| JP | 2011-233315 A | 11/2011 |
| JP | 2014-123609 A | 7/2014 |
| JP | 2017-022125 A | 1/2017 |
| JP | 2017-179428 A | 10/2017 |
| JP | 2018-026464 A | 2/2018 |
| JP | 2021-068776 A | 4/2021 |
| JP | 2021-125457 A | 8/2021 |
| WO | WO-2009/090915 A1 | 7/2009 |
| WO | WO-2016/147993 A1 | 9/2016 |
| WO | WO-2020/217358 A1 | 10/2020 |

* cited by examiner

| | |
|---|---|
| PREPARE BASE BODY | S11 |
| FILL WITH PASTE MEMBER | S12 |
| FIRE PASTE MEMBER | S13 |
| POLISH OR GRIND RESIST PORTION AND WIRING LINE | S14 |

M1B

FIB. 7C
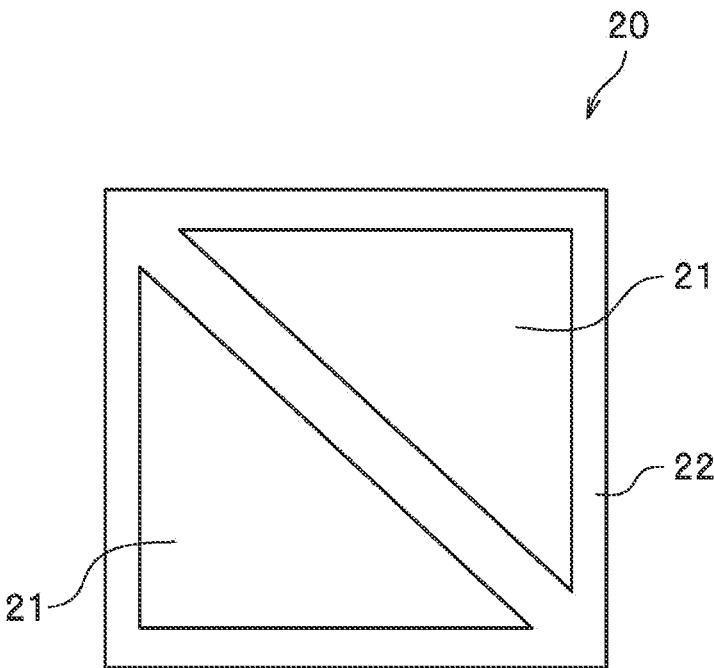

| MANUFACTURE WIRING SUBSTRATE | S31 |

| ELECTRICALLY CONNECT LIGHT-EMITTING ELEMENT AND WIRING SUBSTRATE BY CONDUCTIVE CONNECTION MEMBER | S32 |

| DISPOSE LIGHT GUIDE MEMBER | S33 |

| DISPOSE LIGHT-TRANSMISSIVE MEMBER | S34 |

| DISPOSE LIGHT ADJUSTMENT MEMBER | S35 |

WIRING SUBSTRATE, LIGHT-EMITTING DEVICE, AND MANUFACTURING METHODS THEREOF

CROSS-REFERENCE TO RELATED APPLICATIONS

The present application claims priority under 35 U.S.C. § 119 to Japanese Patent Application No. 2022-122923, filed Aug. 1, 2022, the contents of which are hereby incorporated by reference in their entirety.

BACKGROUND

1. Technical Field

The present disclosure relates to a wiring substrate, a light-emitting device, and manufacturing methods of the wiring substrate and the light-emitting device.

2. Description of Related Art

There is known a technique in which metal particles having a small particle diameter are sintered at a low temperature to form a wiring line or the like. For example, Japanese Patent Publication No. 2004-172283 describes an electromagnetic shielding material in which particles of a metallic powder having a mean particle diameter in a range from 0.1 nm to 100 nm are fused together at a low temperature in a range from 100° C. to 250° C. to form a pattern such as a lattice shape.

SUMMARY

An object of an embodiment according to the present disclosure is to provide a wiring substrate and a light-emitting device in which a wiring line can be formed by sintering metal particles at a low temperature, and methods of manufacturing the wiring substrate and the light-emitting device.

According to one embodiment, a wiring substrate includes a base body having an insulating property and including a first surface and a second surface on a side opposite the first surface; a resist portion covering at least part of the first surface and the second surface of the base body and including a hole portion having a predetermined pattern; and a wiring line disposed in the hole portion of the resist portion so as to be in contact with the base body. In a cross-sectional view in a thickness direction of the base body, a length of an exposed surface of the wiring line exposed from the resist portion is less than a length of a contact surface of the wiring line in contact with the base body.

According to another embodiment, a light-emitting device includes the wiring substrate disclosed in the embodiment; and a light source including a light-emitting element and disposed over the wiring substrate.

According to another embodiment, a method of manufacturing a wiring substrate includes preparing a base body having an insulating property and including a first surface and a second surface on a side opposite the first surface, the base body being provided with a resist portion covering at least one of the first surface and the second surface of the base body and including a hole portion exposing part of the first surface and the second surface of the base body from the resist portion; filling the hole portion of the resist portion with a paste member containing metal particles; and firing the paste member at a temperature of 150° C. or higher and lower than a melting point of the metal particles. In the preparing the base body, the hole portion is formed so as to have an inner bottom surface having a larger width than an opening of the hole portion. In the firing the paste member, the metal particles are sintered to form a wiring line in a shape following the inner bottom surface and an inner lateral surface of the hole portion, and the wiring line is electrically connected.

According to another embodiment, a method of manufacturing a light-emitting device includes manufacturing a wiring substrate by the method of manufacturing a wiring substrate disclosed in the embodiment; and disposing a light source including a light-emitting element over the wiring substrate and electrically connecting the light-emitting element and the wiring substrate by a conductive connection member.

According to certain embodiments of the present disclosure, it is possible to provide a wiring substrate and a light-emitting device in which a wiring line can be formed by sintering metal particles at a low temperature, and methods of manufacturing the wiring substrate and the light-emitting device.

BRIEF DESCRIPTION OF THE DRAWINGS

A more complete appreciation of embodiments of the invention and many of the attendant advantages thereof will be readily obtained by reference to the following detailed description when considered in connection with the accompanying drawings.

FIG. 7C is a bottom view illustrating the light source in the light-emitting device according to the embodiment.

DETAILED DESCRIPTION

Figure 1:
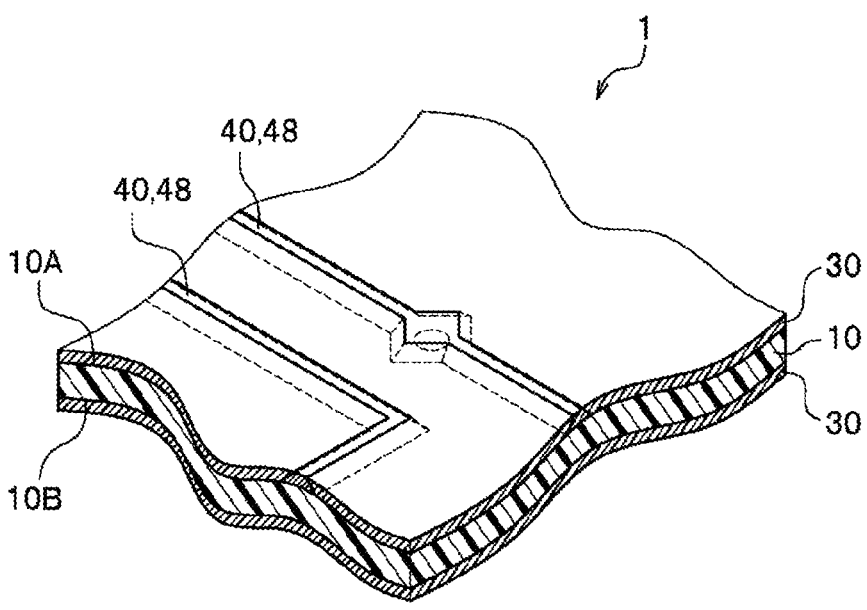
FIG. 1 is a perspective view schematically illustrating a cross section of part of a wiring substrate according to an embodiment.

Embodiments according to the present disclosure will be described below with reference to the drawings. However, the embodiments described below are merely intended to embody the technical concept according to the present disclosure, and the invention is not limited to the following description unless otherwise specified. The content described in one embodiment can also be applied to another embodiment or modified example. The drawings are diagrams that schematically illustrate the embodiments. To provide clarity in the description, scales, intervals, positional relationships, and the like of members may be exaggerated, or some of the members may be omitted in the drawings. Directions illustrated in the drawings indicate relative positions between constitution components and are not intended to indicate absolute positions. Members having the same names and reference characters, as a rule, represent the same members or members of the same quality, and detailed description thereof is omitted as appropriate. In the embodiments, "covering" is not limited to a case of direct contact, but also includes a case of indirectly covering, for example, via another member.

Wiring Substrate

A wiring substrate 1 according to an embodiment will be described with reference to FIGS. 1 to 2E.

Figure 2A:
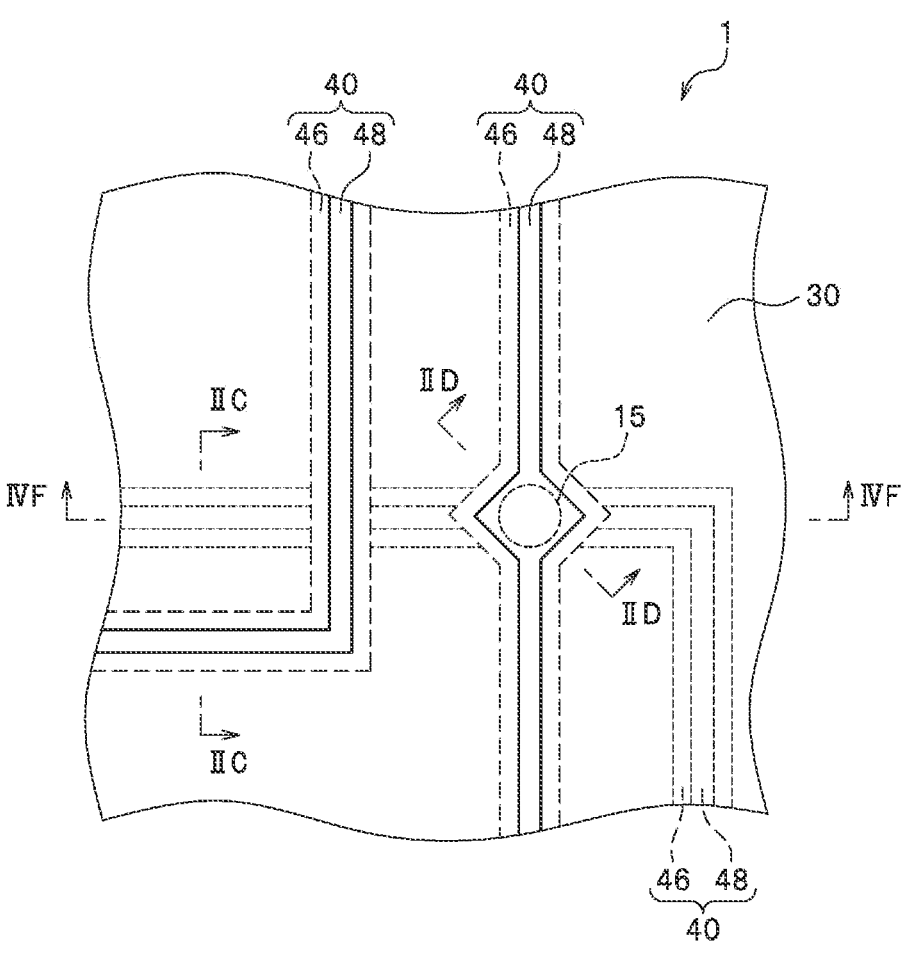
FIG. 2A is a plan view illustrating part of the wiring substrate according to the embodiment.
Figure 2B:
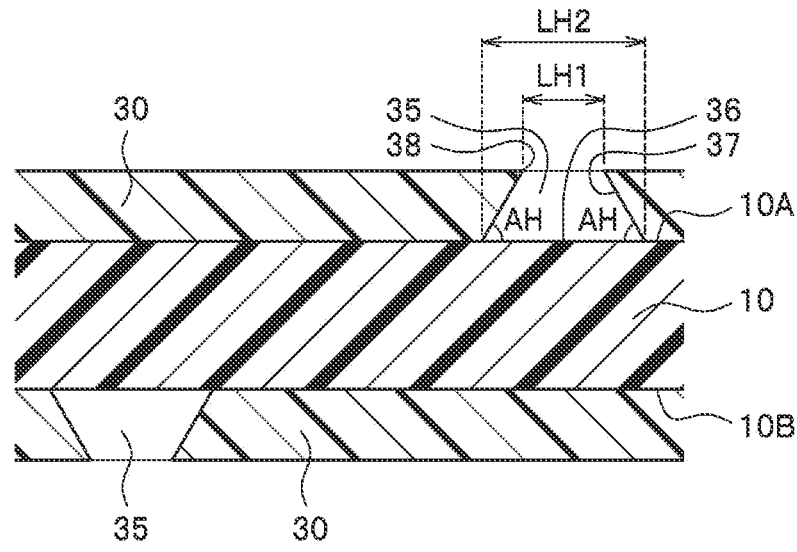
FIG. 2B is a cross-sectional view taken along line IIC-IIC in FIG. 2A in which a wiring line is omitted.
Figure 2C:
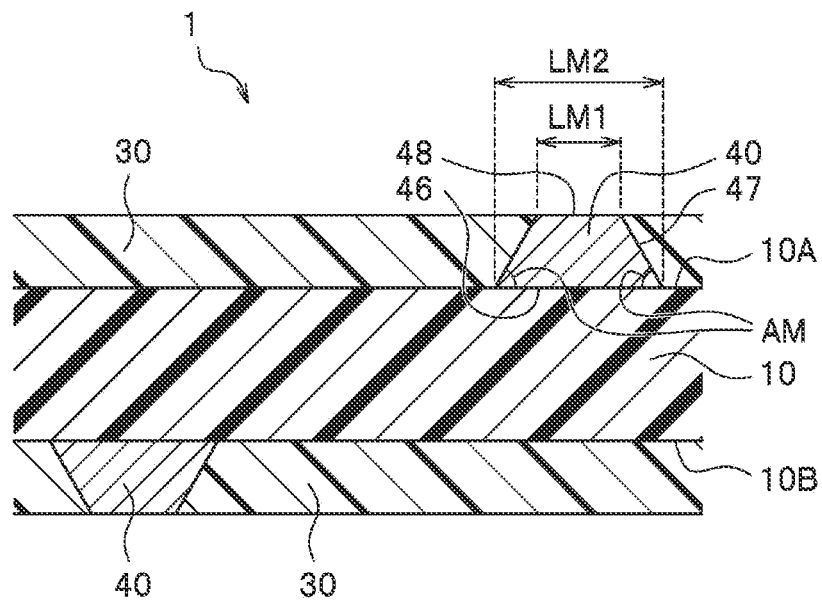
FIG. 2C is a cross-sectional view taken along line IIC-IIC in FIG. 2A.
Figure 2D:
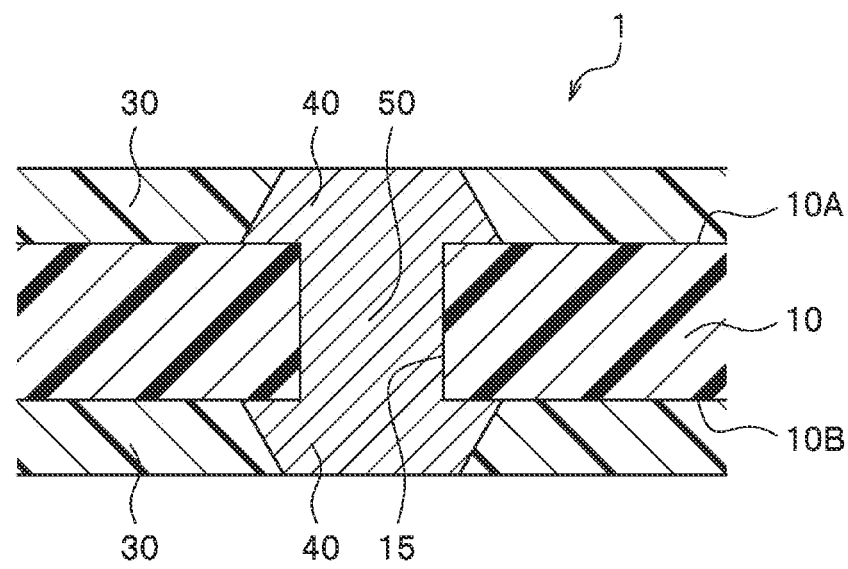
FIG. 2D is a cross-sectional view taken along line IID-IID in FIG. 2A.
Figure 2E:
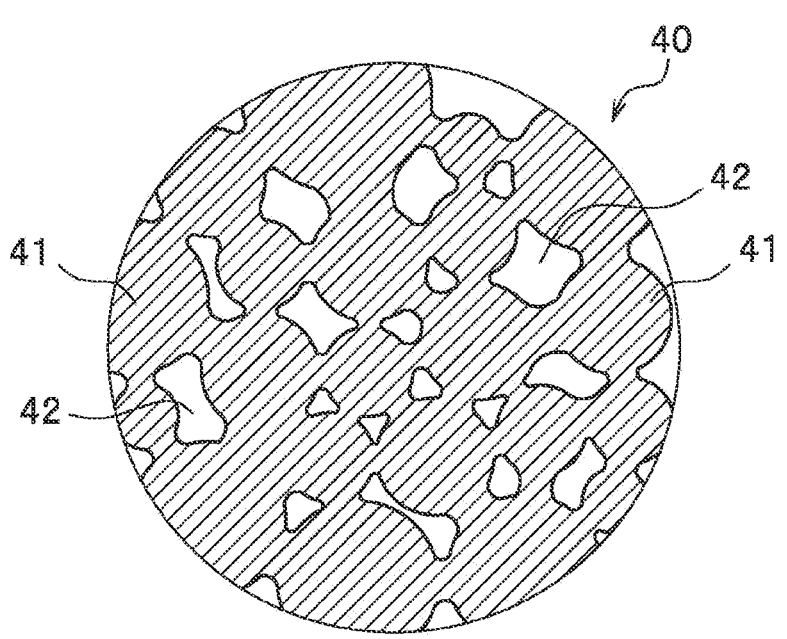
FIG. 2E is an enlarged explanatory view schematically illustrating part of a cross section of the wiring line.

FIG. 1 is a perspective view schematically illustrating a cross section of part of the wiring substrate 1. FIG. 2A is a plan view illustrating part of the wiring substrate 1. FIG. 2B is a cross-sectional view taken along line IIC-IIC in FIG. 2A in which a wiring line 40 is omitted. FIG. 2C is a cross-sectional view taken along line IIC-IIC in FIG. 2A. FIG. 2D is a cross-sectional view taken along line IID-IID in FIG. 2A. FIG. 2E is an enlarged explanatory view schematically illustrating part of a cross section of the wiring line 40.

The wiring substrate 1 includes a base body 10 having an insulating property and including a first surface 10A and a second surface 10B on a side opposite the first surface 10A, a resist portion 30 covering at least part of the first surface 10A and the second surface 10B of the base body 10 and including a hole portion 35 having a predetermined pattern, and the wiring line 40 disposed in the hole portion 35 of the resist portion 30 so as to be in contact with the base body 10. In a cross-sectional view in a thickness direction of the base body 10, a length of an exposed surface 48 of the wiring line 40 exposed from the resist portion 30 is less than a length of a contact surface 46 of the wiring line 40 in contact with the base body 10. The wiring substrate 1 includes via conduction portions 50 that electrically connect the wiring line 40 between the first surface 10A and the second surface 10B.

An example of the wiring substrate 1 is a rigid substrate that is used in an unbent state. Components of the wiring substrate 1 will be described below.

Base Body

The base body 10 is an insulating plate-shaped member serving as a base of the wiring substrate 1. The base body 10 includes the first surface 10A and the second surface 10B on a side opposite the first surface 10A. The first surface 10A and the second surface 10B are both surfaces of the base body 10. A thickness of the base body 10 is not particularly limited, and may be in a range from 60 μm to 500 μm, for example.

The material of the base body 10 may be, for example, a combination of a glass fiber and an epoxy resin, or a resin material such as a ceramic, glass, and a phenol resin, or may be a laminate of these materials. The state of the surface of the base body 10 is not particularly limited. The surface of the base body 10 may be subjected to a plasma treatment or a roughening treatment, or may be coated with an adhesive resin, a silane coupling agent, or the like, To improve adhesion with the resist portion 30 and the wiring line 40.

Resist Portion

The resist portion 30 is an insulating member disposed on the surface of the base body 10. The resist portion 30 covers at least part of the first surface 10A and the second surface 10B of the base body 10. The resist portion 30 includes the hole portion 35 having a predetermined pattern.

The resist portion 30 may be provided only on the first surface 10A, may be provided only on the second surface 10B, or may be provided on both the first surface 10A and the second surface 10B. A thickness of the resist portion 30 is not particularly limited, and may be, for example, in a range from 5 μm to 50 μm, and preferably in a range from 10 μm to 25 μm.

A material used for a solder resist can be used for the resist portion 30. For example, a typical material obtained by mixing a solvent, an anti-foaming agent, and the like with a copolymer resin such as an epoxy resin, or a material whitened by adding a filler such as titanium oxide can be used for the resist portion 30. The color of the resist portion 30 is not particularly limited. However, when a light source or the like is disposed on the wiring substrate 1 to form a light-emitting device, the light reflectivity can be increased by choosing a white color as the color of the resist portion 30.

Hole Portion

The hole portion 35 is a groove-shaped or hole-shaped through portion penetrating the resist portion 30. The hole portion 35 includes an inner bottom surface 36, which is a surface of the base body 10, and inner lateral surfaces 37 that face each other in a cross-sectional view, and an opening 38 is provided on a side of the hole portion 35 opposite to the base body 10.

A length LH1 of the opening 38 is less than a length LH2 of the inner bottom surface 36 in a cross-sectional view in the thickness direction of the base body 10. Note that the length LH1 of the opening 38 and the length LH2 of the inner bottom surface 36 indicate distances between the inner lateral surfaces 37 facing each other and parallel to the surface of the base body 10 in a cross-sectional view. In a plan view, an area of the inner bottom surface 36 is larger than an area of the opening 38.

In a cross-sectional view in the thickness direction of the base body 10, the hole portion 35 has a trapezoidal shape having a long base on the base body 10 side, for example. Abase angle AH of the trapezoidal shape may be, for example, in a range from 40 degrees to 80 degrees, and is preferably in a range from 50 degrees to 70 degrees. When the base angle AH is smaller, peeling of the wiring line 40 is suppressed more advantageously. However, an interval between the adjacent openings 38 is wider, and thus, it may be difficult to shorten a distance between wiring lines.

The hole portion 35 preferably has an isosceles trapezoidal shape in a cross-sectional view in the thickness direction of the base body 10. The inner lateral surfaces 37 may be curved. The wiring line 40 is disposed in the hole portion 35.

Wiring Line

The wiring line 40 is a member serving as a current path. The wiring line 40 is disposed in the hole portion 35 of the resist portion 30 so as to be in contact with the base body 10. The wiring line 40 includes the contact surface 46 having a shape following the inner bottom surface 36 of the hole portion 35, the exposed surface 48 exposed through the opening 38 of the hole portion 35, and lateral surfaces 47 having a shape following the inner lateral surfaces 37 of the hole portion 35.

In a cross-sectional view in the thickness direction of the base body 10, a length LM1 of the exposed surface 48 of the wiring line 40 exposed from the resist portion 30 is less than a length LM2 of the contact surface 46 of the wiring line 40 in contact with the base body 10. The length LM1 of the exposed surface 48 and the length LM2 of the contact surface 46 indicate distances between respective ends of the exposed surface 48 and the contact surface 46 and parallel to the surface of the base body 10 in a cross-sectional view.

Similarly to the hole portion 35, the wiring line 40 has a trapezoidal shape having a long base on the base body 10 side in a cross-sectional view in the thickness direction of the base body 10. Abase angle AM of the trapezoidal shape may be, for example, in a range from 40 degrees to 80 degrees, and is preferably in a range from 50 degrees to 70 degrees.

The wiring line 40 preferably has an isosceles trapezoidal shape in a cross-sectional view in the thickness direction of the base body 10. The lateral surfaces 47 may be curved following the inner lateral surfaces 37 of the hole portion 35.

A thickness of each of the portions of the wiring line 40 positioned on an upper surface side and a lower surface side of the base body 10 is preferably the same as the thickness of the resist portion 30. That is, the total thickness of the wiring line 40 is preferably the sum of the thickness of the resist portion 30 on the upper surface side and the lower surface side of the base body 10 and the thickness of the base body 10. The thickness of each of the portions of the wiring line 40 positioned on the upper surface side and the lower surface side of the base body 10 may be in a range from 5 μm to 50 μm, for example. It is preferable that the thickness of the resist portion 30 is in a range from 20 μm to 30 μm, for example, and the thickness of each of the portions of the wiring line 40 positioned on the upper surface side and the lower surface side of the base body 10 is in a range from 20 μm to 30 μm. The thickness of each of the portions of the wiring line 40 positioned on the upper surface side and the lower surface side of the base body 10 can be adjusted according to the thickness of the resist portion 30. The exposed surface 48 may be recessed or may protrude with respect to the surface of the resist portion 30. However, it is preferable that the exposed surface 48 of the wiring line 40 and the surface of the resist portion 30 form a flat surface parallel to the surface of the base body 10.

The width of the wiring line 40 may be the same as the width of the hole portion 35. For example, in a cross-section perpendicular to a longitudinal direction of the wiring line 40, the length LM1 of the exposed surface 48 may be in a range from 30 μm to 300 μm, and the length LM2 of the contact surface 46 may be in a range from 40 μm to 400 μm.

The wiring line 40 is formed of a sintered compact 41 of metal particles. In the wiring line 40, the metal particles are bonded to each other to form the sintered compact 41, which is different from a wiring line in which metal particles are brought into contact with or close to each other to be fixed by a cured binder resin or the like. The wiring line 40 does not contain an organic substance or contains 1 wt % or less of an organic substance. As illustrated in FIG. 2E, the wiring line 40 is formed so as to contain voids or bubbles, and contains a plurality of bubbles 42, each having a diameter of 5 μm or less, for example. The diameter of the bubble 42 represents a diameter of a circle having the same area as the area of the bubble 42 in a cross section. The bubble 42 of the wiring line 40 may have a diameter greater than 5 μm. The proportion of the bubbles 42 contained in the wiring line 40 is preferably in a range from 1% to 20% per unit volume, for example. The bubbles 42 are generated when the metal particles form the sintered compact 41.

In the wiring line 40, the sintered compact 41 is formed of metal particles, and thus, the electric resistance is low, and the volume resistivity is 10 µΩ·cm or less. The material of the wiring line 40 may be copper or silver, for example.

Via Conduction Portion

Each of the via conduction portions 50 is a member that connects the wiring line 40 between the first surface 10A and the second surface 10B of the base body 10. The via conduction portion 50 is provided in a through hole penetrating the base body 10. The through hole of the base body 10 can be provided in the hole portion 35 in a plan view. When the resist portion 30 and the wiring line 40 are provided on only one surface of the base body 10, the via conduction portion 50 and the through hole are not necessary but may be provided for heat dissipation.

The via conduction portion 50 and the through hole may each have a cylindrical shape or a prismatic shape. A diameter or a diagonal length of the through hole may be greater than the length LH1 of the opening 38 and is set so as not to exceed the length LH2 of the inner bottom surface 36. The material of the via conduction portion 50 may be a material similar to that of the wiring line 40.

In the wiring substrate 1, the length LM1 of the exposed surface 48 is less than the length LM2 of the contact surface 46, and thus, it is possible to suppress peeling of the wiring line 40 and to obtain the wiring line 40 having high reliability.

In the wiring substrate 1, it is possible to effectively suppress the peeling of the wiring line 40 by forming the cross sections of the hole portion 35 and the wiring line 40 into a trapezoidal shape. It is also possible to increase a heat dissipation effect by increasing the contact area between the wiring line 40 and the base body 10.

In the wiring substrate 1, by forming the cross sections of the hole portion 35 and the wiring line 40 into an isosceles trapezoidal shape, the inner lateral surfaces 37 of the hole portion 35 are in contact with the wiring line 40 in a well-balanced manner, and thus, it is possible to more effectively suppress the peeling of the wiring line 40.

The wiring substrate 1 may be a flexible substrate using a sheet-shaped member that allows the base body 10 to be bent and used.

When the wiring substrate 1 is a flexible substrate, the thickness of the base body 10 may be in a range from 20 µm to 100 µm, for example. The material of the base body 10 may be, for example, polyimide, polyethylene terephthalate, or the like. The wiring substrate 1 may be formed by combining a rigid substrate and a flexible substrate such that they are continuous.

The base body 10 formed of a ceramic may be used to obtain a ceramic substrate having excellent heat dissipation as the wiring substrate 1.

When the wiring substrate 1 is a ceramic substrate, the thickness of the base body 10 may be in a range from 100 µm to 1000 µm, for example. The material of the base body 10 may be, for example, aluminum nitride, silicon nitride, or the like.

Method of Manufacturing Wiring Substrate

Subsequently, a method of manufacturing the wiring substrate according to the embodiment will be described with reference to FIGS. 3 to 5B.

Figure 3:
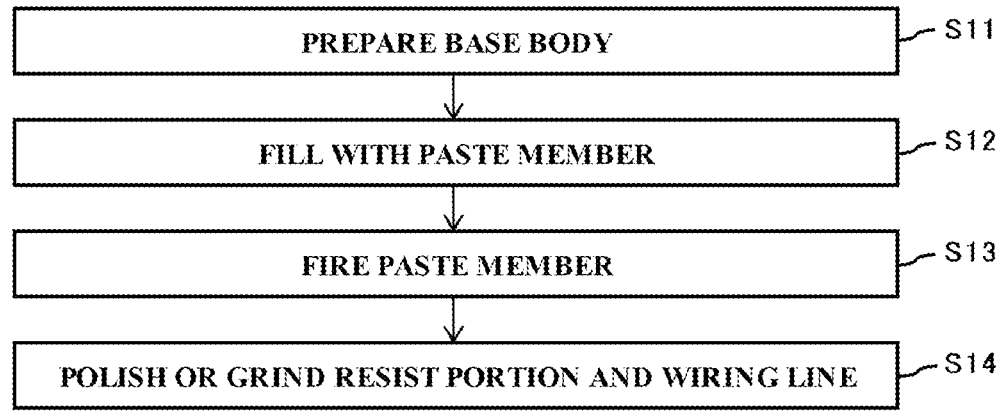
FIG. 3 is a flowchart showing a method of manufacturing the wiring substrate according to the embodiment.
Figure 4A:
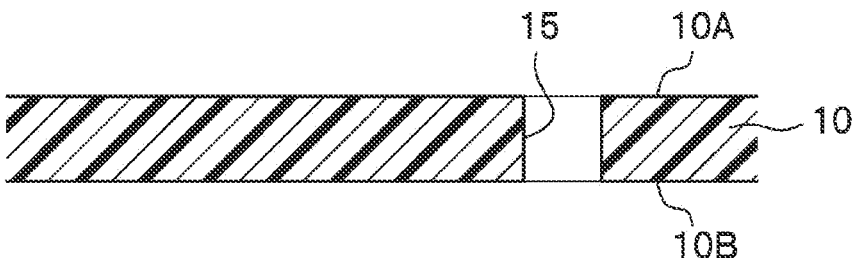
FIG. 4A is a cross-sectional view illustrating the method of manufacturing the wiring substrate according to the embodiment.
Figure 4B:
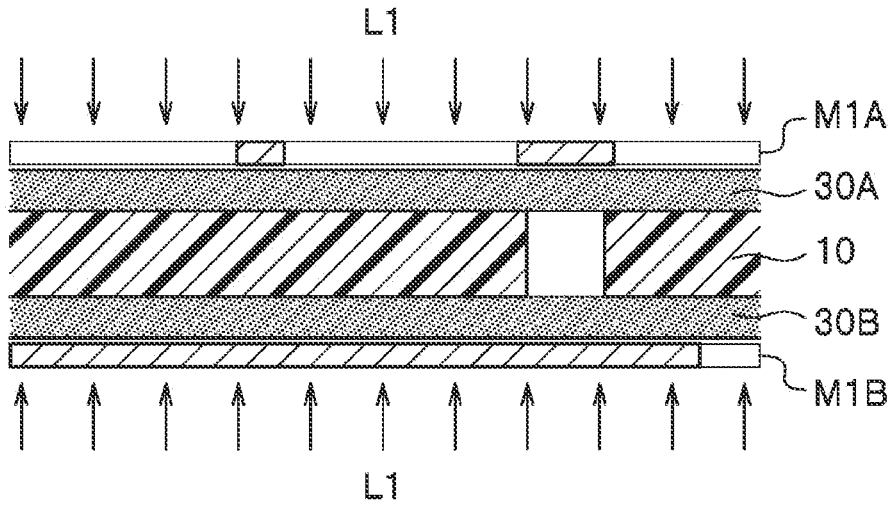
FIG. 4B is a cross-sectional view illustrating the method of manufacturing the wiring substrate according to the embodiment.
Figure 4C:
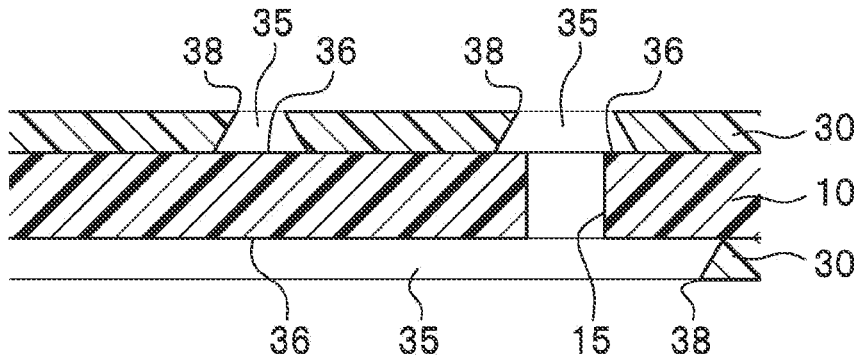
FIG. 4C is a cross-sectional view illustrating the method of manufacturing the wiring substrate according to the embodiment.

FIG. 3 is a flowchart showing the method of manufacturing the wiring substrate 1. FIG. 4A is a cross-sectional view illustrating part of the base body 10 in which a through hole 15 is formed. FIG. 4B is a cross-sectional view illustrating part of the base body 10 on which the resist portion 30 is formed and part of photomasks M1A and M1B. FIG.

Figure 4D:
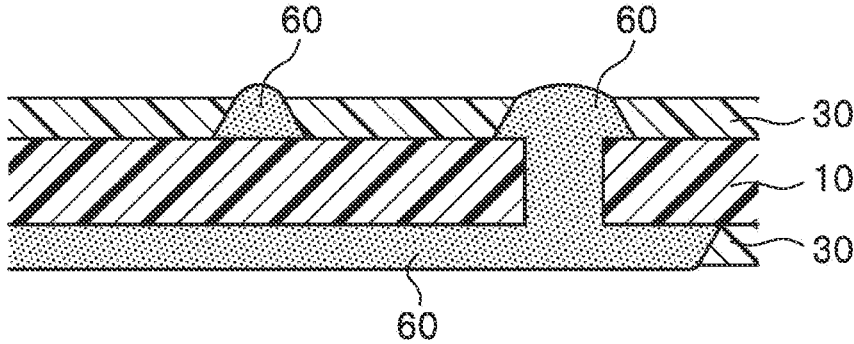
FIG. 4D is a cross-sectional view illustrating the method of manufacturing the wiring substrate according to the embodiment.
Figure 4E:
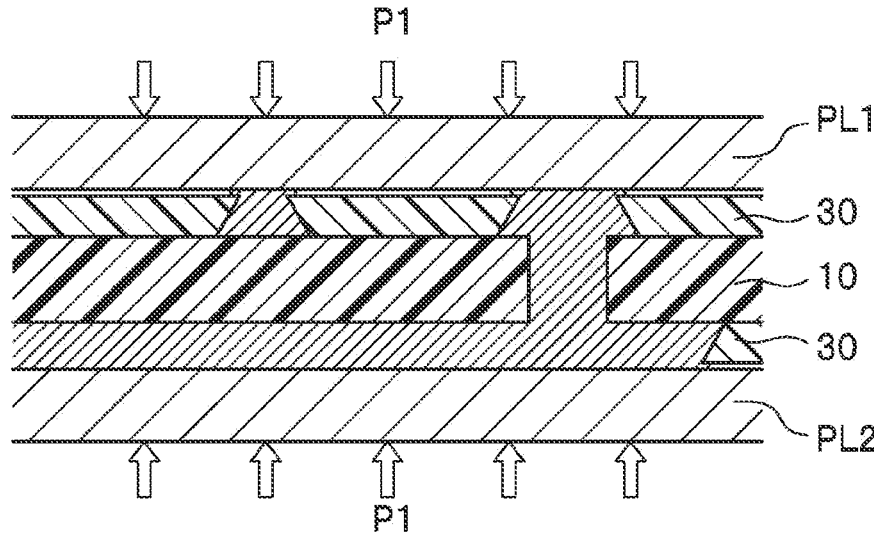
FIG. 4E is a cross-sectional view illustrating the method of manufacturing the wiring substrate according to the embodiment.
Figure 4F:
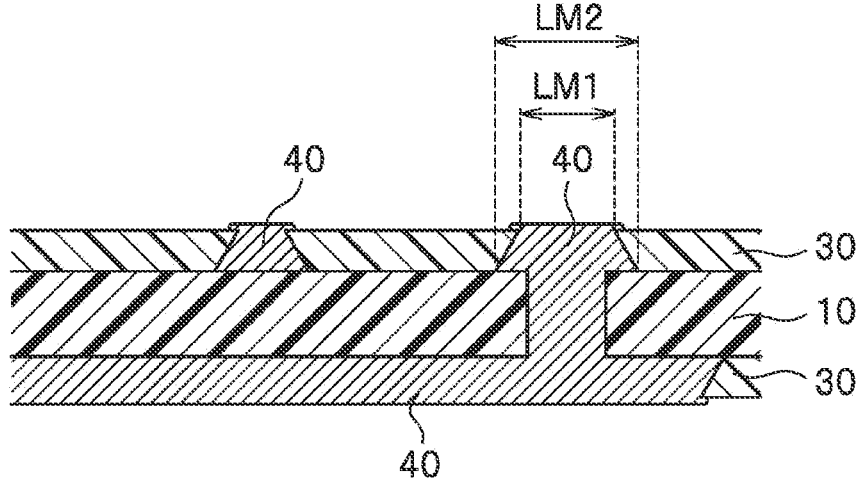
FIG. 4F is a cross-sectional view of FIG. 4E in which plates are omitted.
Figure 4G:
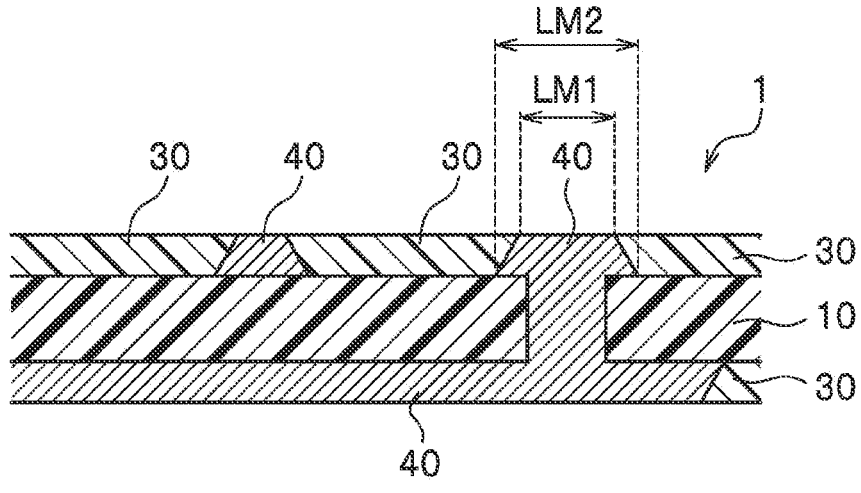
FIG. 4G is a cross-sectional view illustrating the method of manufacturing the wiring substrate according to the embodiment.
Figure 5A:
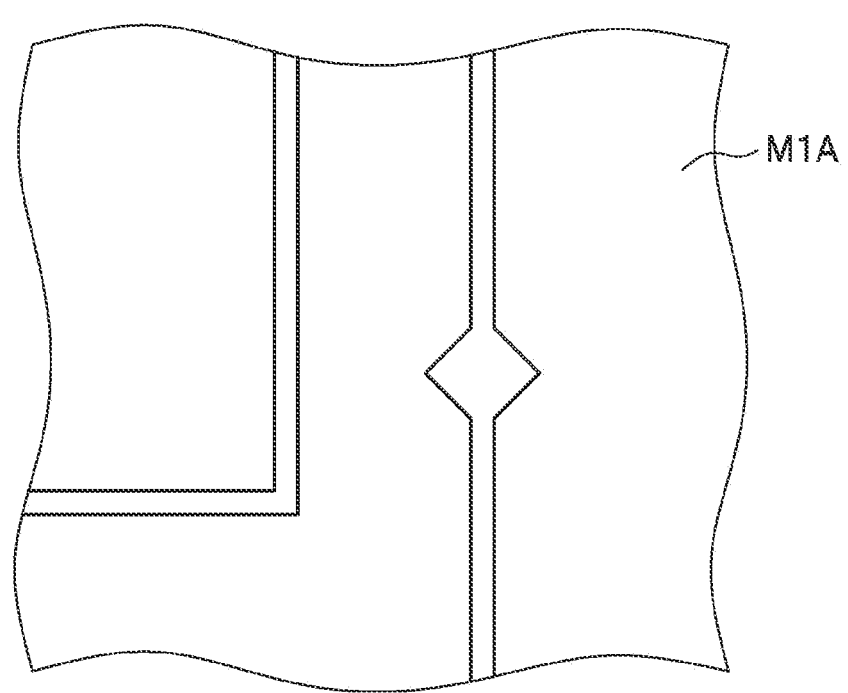
FIG. 5A is a plan view illustrating part of a photomask on a first surface side.
Figure 5B:
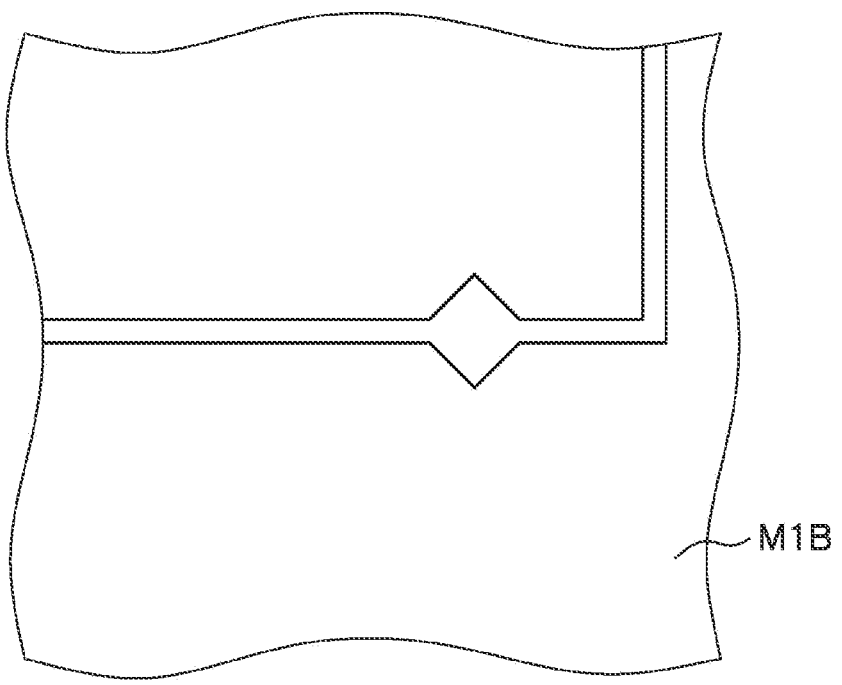
FIG. 5B is a plan view illustrating part of a photomask on a second surface side.

4C is a cross-sectional view illustrating a state in which the hole portions 35 are formed in the resist portion 30. FIG. 4D is a cross-sectional view illustrating a state in which the material of the wiring line 40 is disposed in each of the hole portions 35. FIG. 4E is a cross-sectional view illustrating a state in which the material of the wiring line 40 is heated and pressurized by plates PL1 and PL2. FIG. 4F is a cross-sectional view of FIG. 4E in which the plates PL1 and PL2 are removed. FIG. 4G is a cross-sectional view illustrating a state in which a surface is ground. FIG. 5A is a plan view illustrating part of the photomask M1A on the first surface 10A side. FIG. 5B is a plan view illustrating part of the photomask M1B on the second surface 10B side.

The method of manufacturing the wiring substrate includes: a step S11 of preparing the base body 10 having an insulating property and including the first surface 10A and the second surface 10B on a side opposite the first surface 10A such that the resist portion 30 covers at least one of the first surface 10A and the second surface 10B of the base body 10 and the hole portion 35 is formed in the resist portion 30 so as to expose part of the first surface 10A and the second surface 10B of the base body 10 from the resist portion 30; a step S12 of filling the hole portion 35 of the resist portion 30 with a paste member 60 containing metal particles; and a step S13 of firing the paste member 60 at a temperature of 150° C. or higher and lower than the melting point of the metal particles. In the step S11 of preparing the base body 10, the hole portion 35 is formed such that the width of the inner bottom surface 36 of the hole portion 35 is larger than that of the opening 38. In the step S13 of firing the paste member 60, the metal particles are sintered to form the wiring line 40 in a shape following the inner bottom surface 36 and the inner lateral surfaces 37 of the hole portion 35, and the wiring line 40 is electrically connected. Here, the method of manufacturing the wiring substrate also includes a step S14 of polishing or grinding the resist portion 30 and the wiring line 40 after firing the paste member 60.

Preparing Base Body

In the step S11 of preparing the base body, the resist portion 30 is disposed on the base body 10 having an insulating property. The hole portions 35 are formed in the resist portion 30. The step S11 of preparing the base body includes forming the through hole 15 in the base body 10 and disposing the resist portion 30 on the base body 10. A plasma treatment and a roughening treatment of the surface of the base body 10, application of an adhesive resin, and the like are performed before the resist portion 30 is disposed. The adhesion between the surface of the base body 10 and each of the resist portion 30 and the wiring line 40 can be improved by the plasma treatment, the roughening treatment, the application of the adhesive resin, or the like.

The through hole 15 is formed at a position where the via conduction portion 50 is provided. The through hole 15 can be formed by punching, drilling, laser processing, or the like. The through hole 15 may be formed after the resist portion 30 is disposed. When the via conduction portion 50 is not provided, formation of the through hole 15 may be omitted.

In the resist portion 30, the hole portion 35 is formed on the base body 10 so as to expose part of the first surface 10A and the second surface 10B. The hole portion 35 is formed in a predetermined pattern following the wiring line 40. The hole portion 35 can be formed by photolithography.

An example of photolithography will be described. For the resist portion 30, a material 30A that is cured by exposure is used. The material 30A before being cured of the resist portion is disposed having a constant thickness on the surface of the base body 10. For example, the thickness of the material 30A may be in a range from 5 µm to 50 µm. The material 30A may be disposed by applying an ink type material by screen printing, or by attaching a dry film type material. Here, dry film type materials are disposed on both the first surface 10A and the second surface 10B, but a dry film type material should be disposed on a surface on which the wiring line 40 is provided.

Subsequently, a photomask is used to perform exposure. The photomask M1A is used on the first surface 10A side, and the photomask M1B is used on the second surface 10B side. In the photomasks M1A and M1B, a pattern that blocks light is formed in the size and shape of the opening 38. For example, the exposure conditions may include a wavelength of irradiation light L1 in a range from 300 nm to 500 nm, and an exposure amount in a range from 20 mJ/cm$^2$ to 1000 mJ/cm$^2$. The exposure time may be in a range from 10 seconds to 30 seconds, for example. A portion that is not cured is removed, for example, in an alkaline aqueous solution, and then, the remaining portion is heated to be further cured.

In such photolithography, by changing, in accordance with the transmissivity of the material 30A of the resist portion, the intensity or the like of light that is emitted, it is possible to adjust the size of the inner bottom surface 36 spreading with respect to the opening 38, the base angle of the trapezoidal shape of the hole portion 35 in a cross-sectional view, and the like.

Filling with Paste Member

In the step S12 of filling with a paste member, the hole portion 35 is filled with the paste member 60 containing metal particles. For example, the hole portion 35 may be filled with the paste member 60 by screen printing, gravure printing, spray coating, or the like. Here, a site where the wiring line 40 is to be formed and a site where the via conduction portion 50 is to be formed are collectively filled with the paste member 60, but the sites may be separately filled with the paste member 60. The paste member 60 can be filled so as to rise from the opening 38 of the hole portion 35. The paste member 60 may be printed on or applied to the entire surface including the surface of the resist portion 30, instead of selectively filling the hole portion 35.

For example, the paste member 60 contains, at a proportion in a range from 5% to 20% of the weight of the metal particles, an organic solvent having a boiling point in a range from 200° C. to 300° C. and a reducing property. The paste member 60 is fired at a temperature in a range from 200° C. to 300° C., which will be described later. When the boiling point of the organic solvent is in the temperature range in which the paste member 60 is fired or in a temperature range slightly lower than the firing temperature, the organic solvent can be vaporized and removed when the paste member 60 is fired. Furthermore, the organic solvent has a reducing property, and thus, it is possible to suppress oxidation of the metal particles and promote sintering. However, the boiling point of the organic solvent contained in the paste member 60 may be in a temperature range slightly lower than the firing temperature. This is because the organic solvent may be vaporized even in a temperature range lower than the firing temperature. This is due to factors such as the thickness and the size of the paste member 60 and how heat is applied to the paste member 60 during firing. Here, the boiling point of the organic solvent contained in the paste member 60 being in a temperature range slightly lower than the firing temperature means that the boiling point of the organic solvent may be in a temperature range lower than the firing temperature and having a difference from the firing temperature of 80° C. or less, or 50° C. or less, for example.

The paste member 60 may contain a resin having a binder effect, a dispersant for supporting the dispersion of metal particles, and the like. In addition, a predetermined additive may be contained so as to reduce printing unevenness such as bleeding or blurring of the paste member 60.

The metal particles may be particles or powder of copper or silver, for example. When the metal particles are copper particles, the particle size may be in a range from 0.1 µm to 10 µm, and preferably in a range from 0.1 µm to 7 µm. The proportion of particles having a particle size in a range from 0.1 µm to 1 µm may be in a range from 40 wt % to 95 wt %, and is preferably in a range from 50 wt % to 80 wt %. When the particle size of the metal particles is 1 µm or less, it is possible to promote sintering.

Firing Paste Member

In the step S13 of firing the paste member, the paste member 60 is pressurized and heated to sinter the metal particles, whereby the sintered compact 41 is obtained. For example, the pressurization and the heating may be performed in the atmosphere in a state where the base body 10 provided with the resist portion 30 including the hole portion 35 filled with the paste member 60 is sandwiched between two plates installed parallel to each other. As for the pressurizing and heating conditions, it is preferable that the paste member 60 is heated in a temperature range from 200° C. to 300° C., while being pressurized at a pressure P1 in a range from 2 MPa to 10 MPa.

Here, after the hole portion 35 is filled with the paste member 60 on each of the first surface 10A side and the second surface 10B side of the base body 10, the surfaces are heated while being simultaneously pressurized at the pressure P1 by the plates PL1 and PL2. Alternatively, after filling with the paste member 60 is performed on one surface side of the base body 10 and pressurization and heating are performed, filling with the paste member 60 on the other surface of the base body 10 and pressurization and heating may be performed.

The pressurization and the heating may be performed in the atmosphere, but are preferably performed in vacuum or in a nitrogen atmosphere. When the heating and the pressurization are performed in vacuum or a nitrogen atmosphere, it is possible to suppress a decrease in reflectance due to discoloration of the resist and to further reduce the resistance of the wiring line.

By pressurizing and heating the paste member 60, the paste member 60 spreads over the entire trapezoidal-shaped inner bottom surface 36 of the hole portion 35, so that a contact area with the base body 10 is secured, and thermal conductivity can be improved. In the wiring line 40 in a state after firing the paste member 60, the length LM1 of the exposed surface 48 exposed from the resist portion 30 is less than the length LM2 of the contact surface 46 in contact with the base body 10.

Polishing or Grinding Resist Portion and Wiring Line

In the step S14 of polishing or grinding the resist portion and the wiring line, the wiring line 40 protruding from the resist portion 30 is removed. At this time, part of the surface of the resist portion 30 may also be removed. The amount of polishing is preferably 5 µm or less. The amount of polishing is preferably in a range from 1 µm to 45 µm, and more preferably in a range from 5 µm to 25 µm. By also removing part of the resist portion 30, the thicknesses of the wiring line 40 and the resist portion 30 can be adjusted, and further, the insulation between wiring lines separated by the resist portion 30 can be stably ensured. It is preferable that the exposed surface 48 of the wiring line 40 and the surface of the resist portion 30 form a flat surface parallel to the surface of the base body 10. A surface roughness Ra after polishing or grinding is preferably 0.5 μm or less, and more preferably 0.1 μm or less. By reducing the surface roughness, it is possible to set a film thickness of a plating, a thickness of an organic rust prevention treatment agent, and the like within a predetermined thickness range, and it is possible to improve the mounting reliability of a component mounted on the surface of the wiring line 40.

In the polishing or grinding, a processing apparatus using abrasive grains may be used. In addition to polishing processing and grinding processing, cutting processing and blasting processing may be employed. In the wiring line 40 in a state after polishing or grinding the resist portion 30 and the wiring line 40, the length LM1 of the exposed surface 48 exposed from the resist portion 30 is less than the length LM2 of the contact surface 46 in contact with the base body 10.

In the method of manufacturing the wiring substrate, by filling the hole portion 35 with the paste member 60, the wiring line 40 can be formed following the shape of the hole portion 35. Even when the wiring line 40 is formed thin, breaks in the pattern are suppressed, and the wiring line 40 can be formed with a stable width. In addition, the wiring line 40 can be formed thick when the resist portion 30 is formed thick, and peeling of the wiring line 40 can be suppressed by setting the length LM1 of the exposed surface 48 to be less than the length LM2 of the contact surface 46.

In the method of manufacturing the wiring substrate, by filling, with the paste member 60, the hole portion 35 of the resist portion 30 formed by photolithography, a pattern width and a pattern interval can be reduced to achieve miniaturization, as compared with a case in which the paste member 60 is applied by a printing method, for example. The wiring line 40 is formed of the sintered compact 41 containing metal particles, so that the electric resistance can be reduced.

It is preferable that an exposed portion of the wiring line 40 other than a site where a circuit component or the like is mounted is further covered with an insulating member such as a solder resist or a protective film. Thus, a short circuit due to a foreign matter between the wiring lines 40 can be suppressed, and the migration resistance can be improved.

Light-Emitting Device (First Embodiment)

Subsequently, a light-emitting device 100 according to the first embodiment will be described with reference to FIGS. 6A to 7D.

Figure 6A:
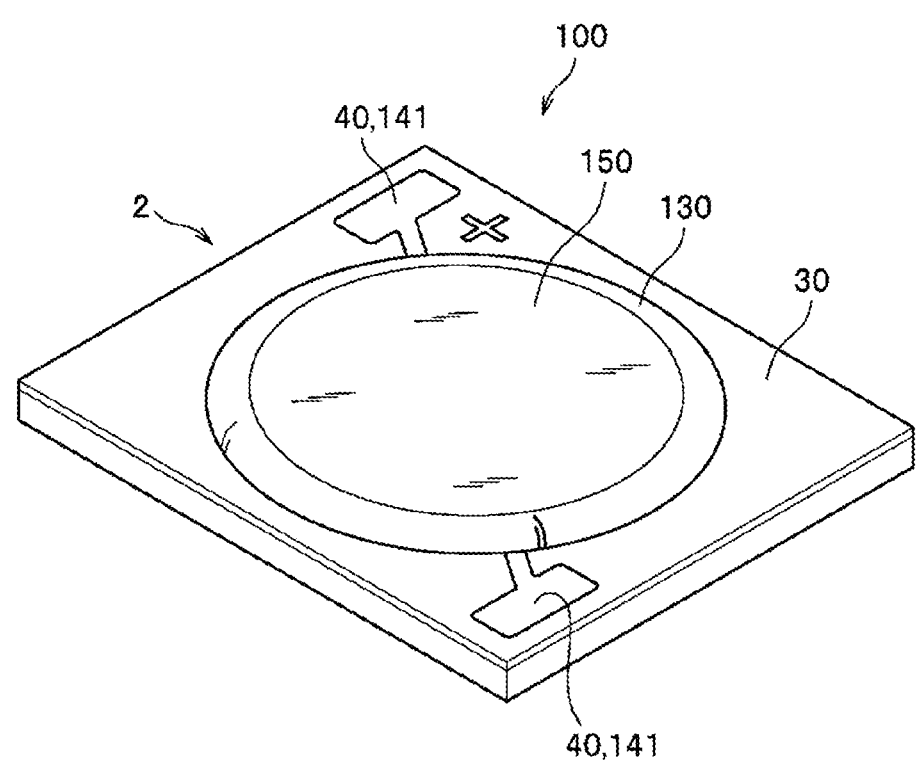
FIG. 6A is a perspective view illustrating a light-emitting device according to a first embodiment.
Figure 6B:
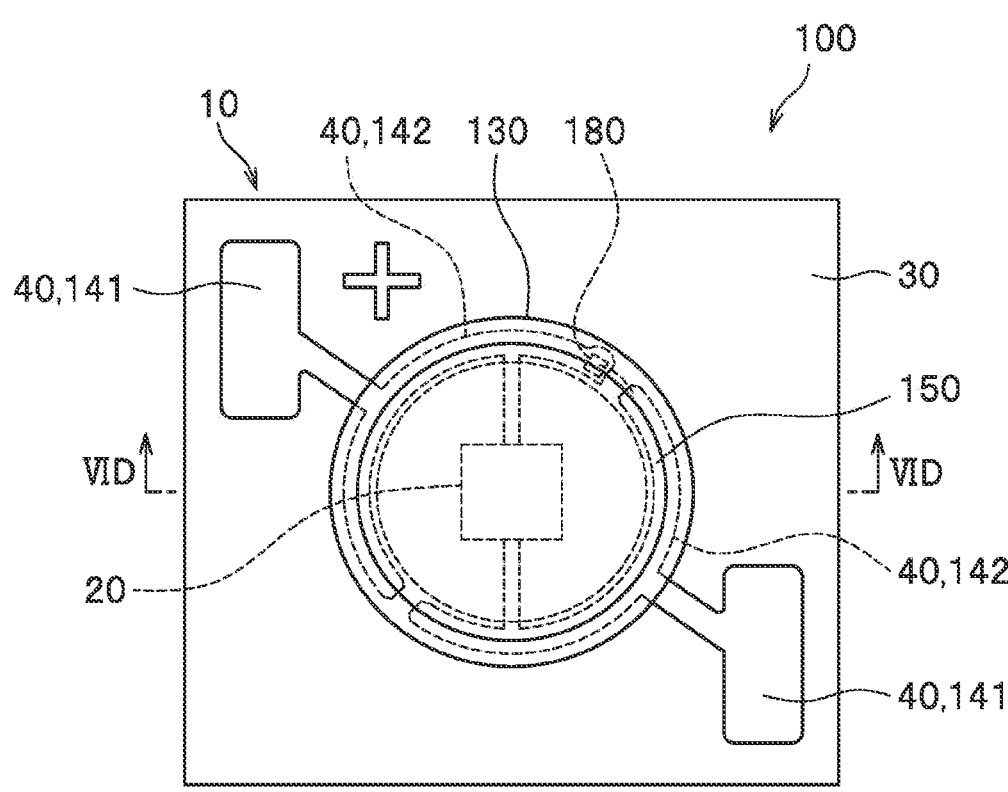
FIG. 6B is a plan view illustrating the light-emitting device according to the first embodiment.
Figure 6C:
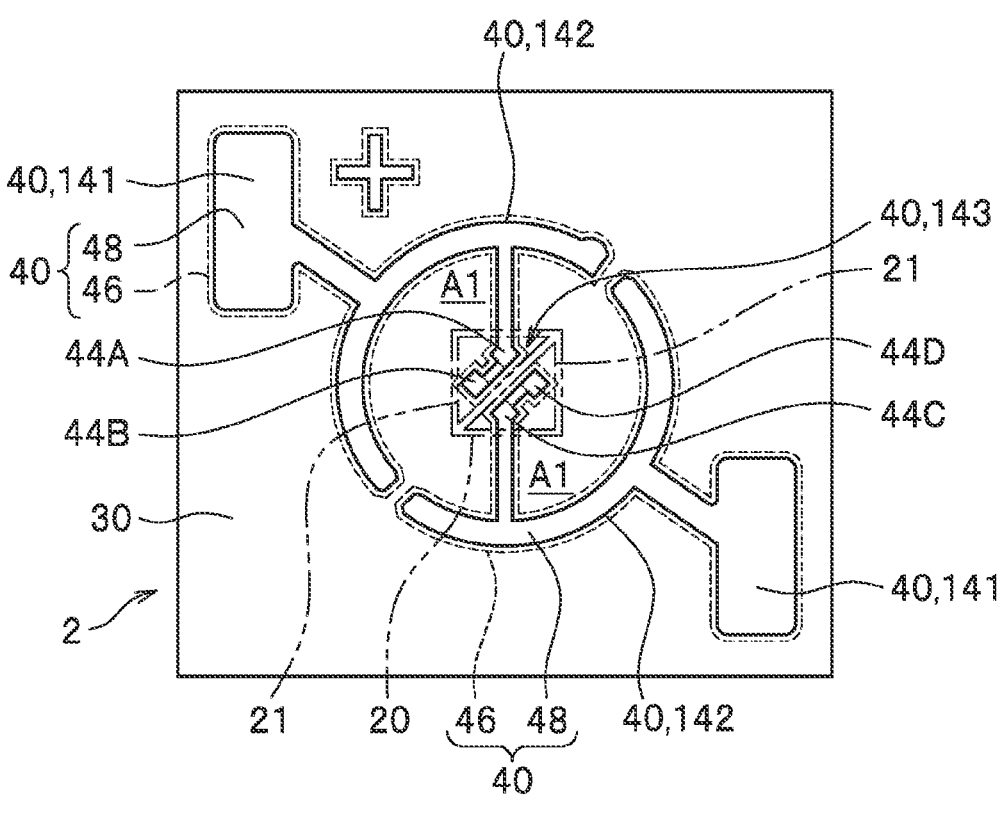
FIG. 6C is a plan view illustrating a wiring substrate in the light-emitting device according to the first embodiment.
Figure 6D:
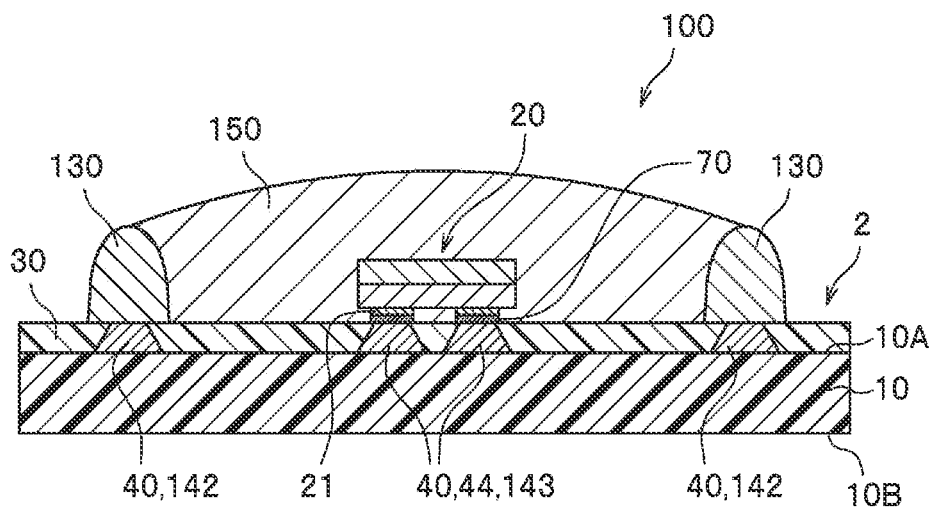
FIG. 6D is a cross-sectional view taken along line VID-VID in FIG. 6B.
Figure 7A:
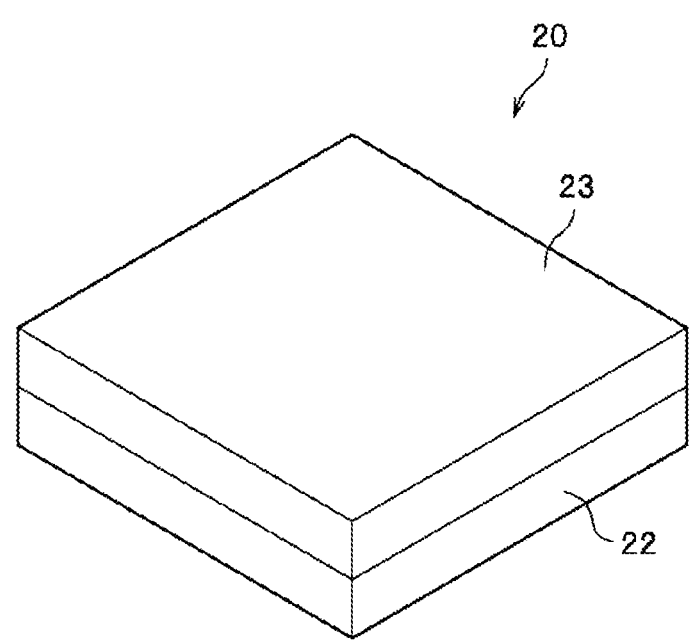
FIG. 7A is a perspective view illustrating a light source in the light-emitting device according to the embodiment.
Figure 7B:
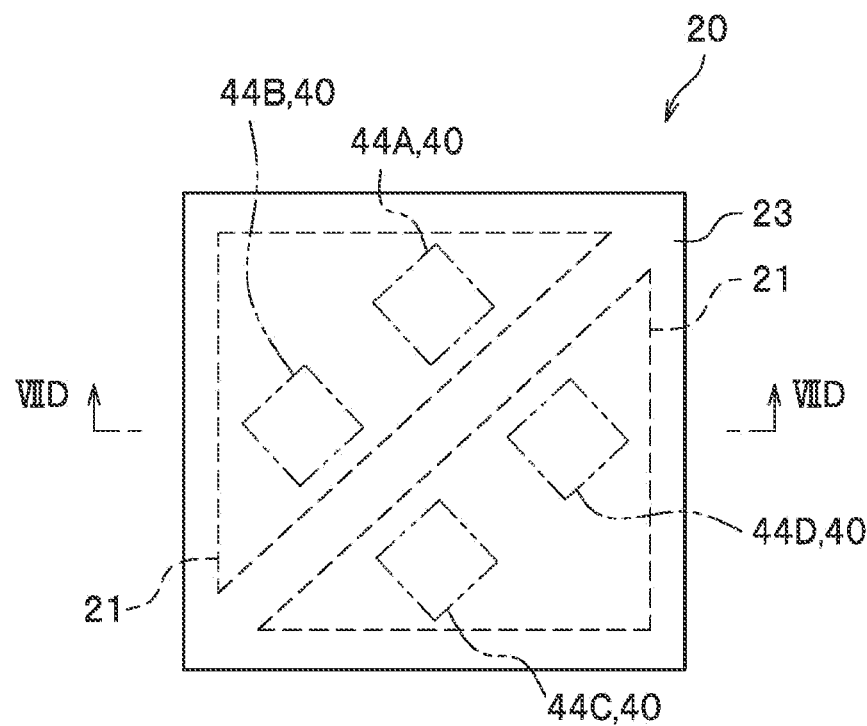
FIG. 7B is a plan view illustrating the light source in the light-emitting device according to the embodiment.
Figure 7D:
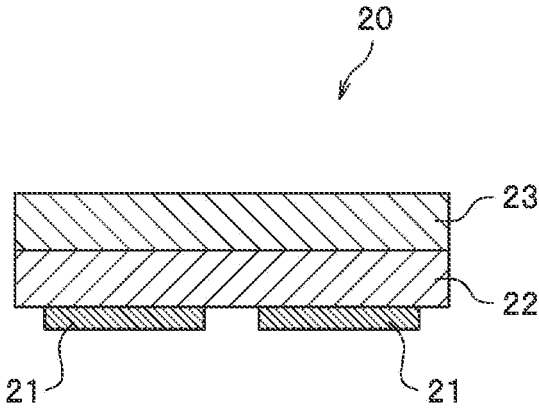
FIG. 7D is a cross-sectional view taken along line VIID-VIID in FIG. 7B.

FIG. 6A is a perspective view illustrating the light-emitting device 100. FIG. 6B is a plan view illustrating the light-emitting device 100. FIG. 6C is a plan view illustrating a wiring substrate 2 of the light-emitting device 100. FIG. 6D is a cross-sectional view taken along line VID-VID in FIG. 6B. FIG. 7A is a perspective view illustrating a light source 20. FIG. 7B is a plan view illustrating the light source 20. FIG. 7C is a bottom view illustrating the light source 20. FIG. 7D is a cross-sectional view taken along line VIID-VIID in FIG. 7B.

The light-emitting device 100 includes the wiring substrate 2 according to the embodiment, and the light source 20 disposed over the wiring substrate 2 and including a light-emitting element 22. Here, the light-emitting device 100 includes a frame member 130 that surrounds the light source 20 over the wiring substrate 2 so as to be spaced apart from the light source 20, and a sealing member 150 that covers the light source 20. The light source 20 is disposed at a center of a circular region surrounded by the frame member 130.

For example, the light-emitting device 100 is a chip on board (COB) type light-emitting device in which one light source 20 is disposed over the wiring substrate 2. Components of the light-emitting device 100 will be described below.

Wiring Substrate

The wiring substrate 2 is a ceramic substrate, and the resist portion 30 and the wiring line 40 are formed only on the first surface 10A of the base body 10. In the other aspects, the wiring substrate 2 is similar to the wiring substrate 1, that is, the wiring line 40 is disposed in the hole portion 35 of the resist portion 30 so as to be in contact with the base body 10, and in a cross-sectional view in the thickness direction of the base body 10, the length of the exposed surface 48 of the wiring line 40 exposed from the resist portion 30 is less than the length of the contact surface 46 of the wiring line 40 in contact with the base body 10. Here, the wiring substrate 2 has a rectangular shape, and the first surface 10A is an upper surface.

The resist portion 30 is preferably white to enhance light reflectivity. To obtain white coloring, a base material may contain a white pigment such as titanium oxide, aluminum oxide, calcium carbonate, barium sulfate, magnesium oxide, or silicon oxide, for example.

In a plan view, the wiring line 40 includes a pair of positive and negative external electrodes 141 each having a rectangular shape and internal electrodes 142 each having a semicircular arc shape and being continuous with the corresponding external electrode 141. The external electrodes 141 are provided at opposing corner portions of the wiring substrate 2. The internal electrodes 142 are provided so as to surround a region A1 having a circular shape in which the light source 20 is disposed. Light source electrodes 143 for disposing the light source 20 are provided at a center of the region A1 and are continuous with the internal electrodes 142. Each of the light source electrodes 143 includes four pad portions 44A to 44D. Each exposed surface 48 of the pad portions 44A to 44D has a square shape in a plan view, and the pad portions 44A to 44D are spaced apart from each other in two rows and two columns.

The pad portions 44A and 44B face one of a pair of element electrodes 21, and the pad portions 44C and 44D face the other of the pair of element electrodes 21. A lower surface of the light source 20 faces the resist portion 30, between the pair of element electrodes 21. Here, the pad portion 44A and the pad portion 44B are connected to each other on the upper surface side of the wiring substrate 2, and the pad portion 44C and the pad portion 44D are connected to each other on the upper surface side of the wiring substrate 2. Hereinafter, the pad portions 44A to 44D may be collectively referred to as pad portions 44.

Surfaces of the pad portions 44A, 44B, 44C, and 44D exposed from the resist portion 30 may be subjected to an organic rust prevention treatment or Ni—Pd—Au or Ni—Au plating to improve the reliability of soldering or Au-bump connections.

Light Source

Here, an example in which the light source 20 includes the light-emitting element 22 including the pair of element electrodes 21 and a resin member 23 disposed on a side of a light extraction surface of the light-emitting element 22 is described. However, the light source 20 may include only the light-emitting element 22, without being provided with the resin member 23 on the light-emitting element 22.

The light-emitting element 22 includes a semiconductor layered body. Here, the resin member 23 is disposed on an upper surface side of the semiconductor layered body, and the pair of element electrodes 21 is provided on a lower surface side of the semiconductor layered body. The semiconductor layered body may have any composition depending on the desired emission wavelength. For example, a nitride semiconductor ($In_xAl_yGa_{1-x-y}N$, where $0 \leq x$, $0 \leq y$ $x+y \leq 1$) or GaP that can emit blue or green light, or GaAlAs or AlInGaP that can emit red light may be used. The size and shape of the light-emitting element 22 can be appropriately selected according to the purpose of use.

For example, the resin member 23 is formed of a light-transmissive resin material, and an epoxy resin, a silicone resin, a resin in which an epoxy resin and a silicone resin are mixed, or the like can be used. The resin member 23 may contain a phosphor. For example, when the resin member 23 contains a phosphor that absorbs blue light from the light-emitting element 22 and emits yellow light, white light can be emitted from the light source 20. Furthermore, the resin member 23 may contain a plurality of types of phosphors. For example, when the resin member 23 contains a phosphor that absorbs blue light from the light-emitting element 22 and emits green light and a phosphor that emits red light, white light can be emitted from the light source 20.

The resin member 23 may further contain a light-emitting material such as a phosphor or quantum dots. Examples of such a phosphor include yttrium-aluminum (gallium-doped) garnet activated with cerium, nitrogen-containing calcium (strontium) aluminosilicate activated with europium, potassium fluorosilicate activated with manganese, and a $\beta$-SiALON phosphor. Specific examples of the phosphor include an yttrium aluminum garnet phosphor (for example, $(Y,Gd)_3$ $(Al,Ga)_5O_{12}$:Ce), a lutetium aluminum garnet phosphor (for example, $Lu_3(Al,Ga)_5O_{12}$:Ce), a terbium aluminum garnet phosphor (for example, $Tb_3(Al,Ga)_5O_{12}$:Ce), a CCA phosphor (for example, $Ca_{10}(PO_4)_6Cl_2$:Eu), an SAE phosphor (for example, $Sr_4Al_{14}O_{25}$:Eu), a chlorosilicate phosphor (for example, $CasMgSi_4O_{16}Cl_2$:Eu), a silicate phosphor (for example, $(Ba,Sr,Ca,Mg)_2SiO_4$:Eu), oxynitride phosphors such as a $\beta$-SiAlON phosphor (for example, $(Si,Al)_3$ $(O,N)_4$:Eu) and an $\alpha$-SiAlON phosphor (for example, $Ca(Si,$ $Al)_{12}(O,N)_{16}$:Eu), nitride phosphors such as an LSN phosphor (for example, $(La,Y)_3Si_6N_{11}$:Ce), a BSESN phosphor (for example, $(Ba,Sr)_2Si_5N_8$:Eu), an SLA phosphor (for example, $SrLiAl_3N_4$:Eu), a CASN phosphor (for example, $CaAlSiN_3$:Eu), and an SCASN phosphor (for example, $(Sr,Ca)AlSiN_3$:Eu), fluoride phosphors such as a KSF phosphor (for example, $K_2SiF_6$:Mn), a KSAF phosphor (for example, $K_2(Si_{1-x}Al_x)F_{6-x}$:Mn, where x satisfies $0<x<1$), and an MGF phosphor (for example, $3.5MgO \cdot 0.5MgF_2 \cdot GeO_2$:Mn), and the like. Examples of the quantum dots include quantum dots having a perovskite structure (for example, $(Cs, FA, MA) (Pb, Sn) (F, Cl, Br, I)_3$, where FA represents formamidinium and MA represents methylammonium), II-VI group quantum dots (for example, CdSe), III-V group quantum dots (for example, InP), quantum dots having a chalcopyrite structure (for example, $(Ag,Cu)(In,Ga)(S,Se)_2$), and the like.

In a plan view, each electrode of the pair of element electrodes 21 has a triangular shape, is disposed so as to enclose two of the pad portions 44, and is connected to the corresponding light source electrode 143 via a conductive connection member 70. As the conductive connection member 70, for example, a bump formed of gold, silver, copper, or the like, a conductive paste obtained as a mixture of a resin binder and powder of a metal such as gold, silver, copper, platinum, or aluminum, a tin-silver-copper (SAC) solder, a tin-bismuth (SnBi) solder, or the like can be used.
Frame Member The frame member 130 is a member serving as a frame that defines a light-emitting region in the light-emitting device 100. Furthermore, the frame member 130 is a member serving as a frame for disposing the sealing member 150.

The frame member 130 surrounds the light source 20 so as to be spaced apart from the light source 20. The frame member 130 has a larger width than the internal electrodes 142, is formed in a circular shape so as to cover the internal electrodes 142, and surrounds the region A1 where the light source 20 is disposed. The frame member 130 preferably has light reflectivity. The frame member 130 may have an elliptical shape or a polygonal shape such as a quadrangular shape, a pentagonal shape, or a hexagonal shape in a plan view in accordance with the shape of the region A1 in which the light source 20 is disposed.

The frame member 130 preferably spreads toward the wiring substrate 2 in a cross-sectional view. The frame member 130 is formed such that a height of the frame member 130 from the upper surface of the wiring substrate 2 is higher than at least the upper surface of the light source 20.

The frame member 130 has an insulating property and light reflectivity, and may be formed of a resin or a ceramic containing a light-diffusing material, for example. Examples of the resin may include a silicone resin, an epoxy resin, and the like, and examples of the ceramic may include boron nitride, silicon oxide, aluminum oxide, silicon carbide, and the like. The light-diffusing material may be titanium oxide, silicon oxide, or the like.
Sealing Member The sealing member 150 is a member disposed in the light-emitting region of the light-emitting device 100. An upper surface of the sealing member 150 is a light-emitting surface of the light-emitting device 100. The sealing member 150 is a member that covers and protects the light source 20.

The sealing member 150 fills an interior region surrounded by the frame member 130. A height of the sealing member 150 is not particularly limited. For example, an orientation angle can be increased by designing the sealing member 150 to have a height that is the same as or higher than the height of an upper end of the frame member 130. It is preferable that, in the sealing member 150, a central portion is higher than a peripheral edge portion and the sealing member 150 has a convex shape in a cross-sectional view. Thus, in the light-emitting device 100, it is possible to increase the brightness when viewed from above. On the other hand, when the sealing member 150 is designed to have a height lower than the height of the upper end of the frame member 130, it is possible to cut light in the lateral direction.

The sealing member 150 preferably has an insulating property and transmissivity, and is excellent in weather resistance and light resistance. The material of the sealing member 150 may be, for example, a resin containing silicone, epoxy, phenol, polycarbonate, acrylic, or the like as a base material. The sealing member 150 may contain a wavelength conversion substance or a light-diffusing material as a filler.

A protective element 180 may be provided between the positive and negative internal electrodes 142. For example, a Zener diode, a varistor, a resistor, or a capacitor may be employed as the protective element 180.

The light source electrodes 143 may have any shape as long as the light source electrodes 143 are enclosed by the element electrodes 21 of the light source 20 in a plan view, and may have, for example, a triangular shape similar to that of the element electrodes 21.

The light-emitting element 22 may be disposed over the wiring substrate 2 alone, instead of providing the light source 20. The light-emitting element 22 may be disposed over the wiring substrate 2 with the element electrodes 21 forming an upper surface. In this case, it is possible to connect the element electrodes 21 and the internal electrodes 142 by a wire, without providing the light source electrodes 143. The light-emitting device 100 may include a plurality of light sources 20 or a plurality of light-emitting elements 22. Light emission peak wavelengths of the plurality of light sources 20 or the plurality of light-emitting elements 22 may be the same or different.

Method of Manufacturing Light-Emitting Device (First Embodiment)

Subsequently, a method of manufacturing the light-emitting device 100 according to the first embodiment will be described with reference to FIGS. 8 to 9D.

Figure 8:
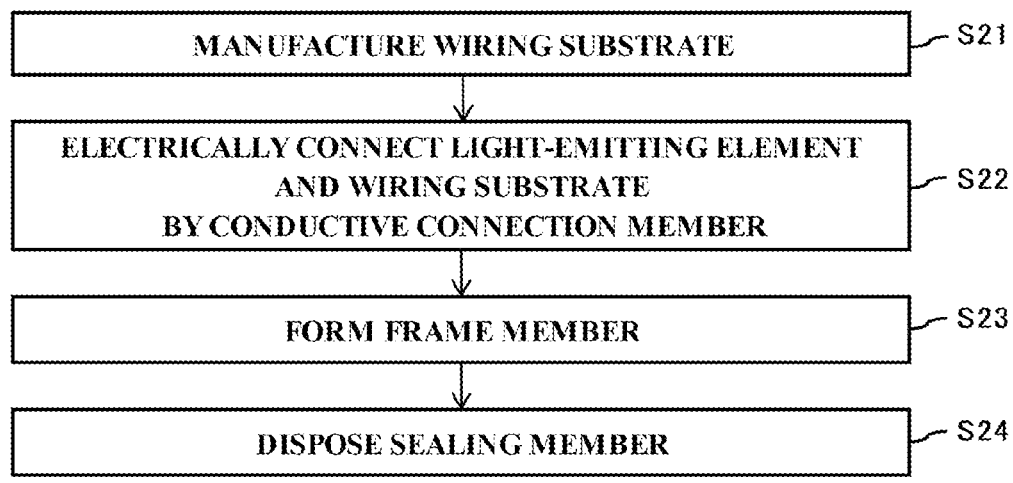
FIG. 8 is a flowchart showing a method of manufacturing the light-emitting device according to the first embodiment.
Figure 9A:
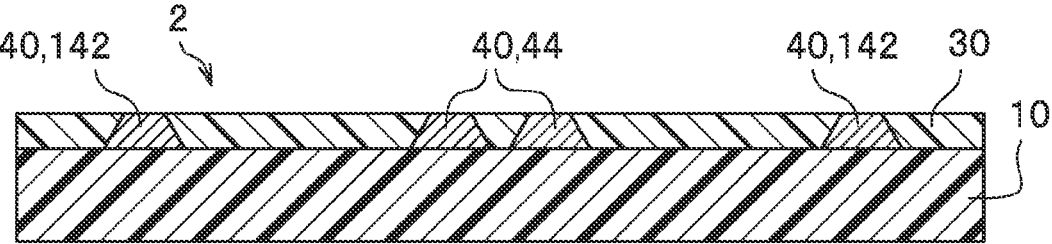
FIG. 9A is a cross-sectional view illustrating the method of manufacturing the light-emitting device according to the first embodiment.
Figure 9B:
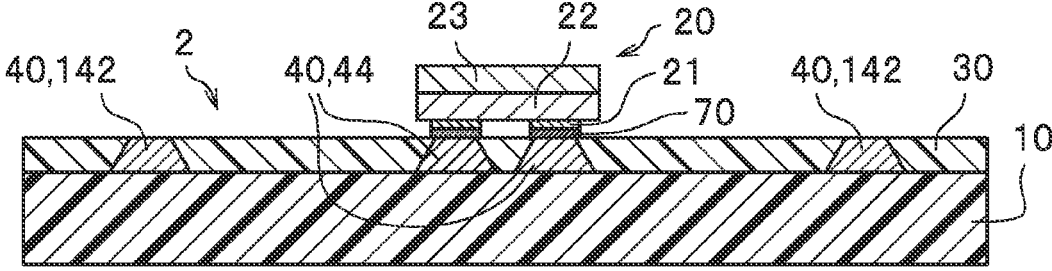
FIG. 9B is a cross-sectional view illustrating the method of manufacturing the light-emitting device according to the first embodiment.
Figure 9C:
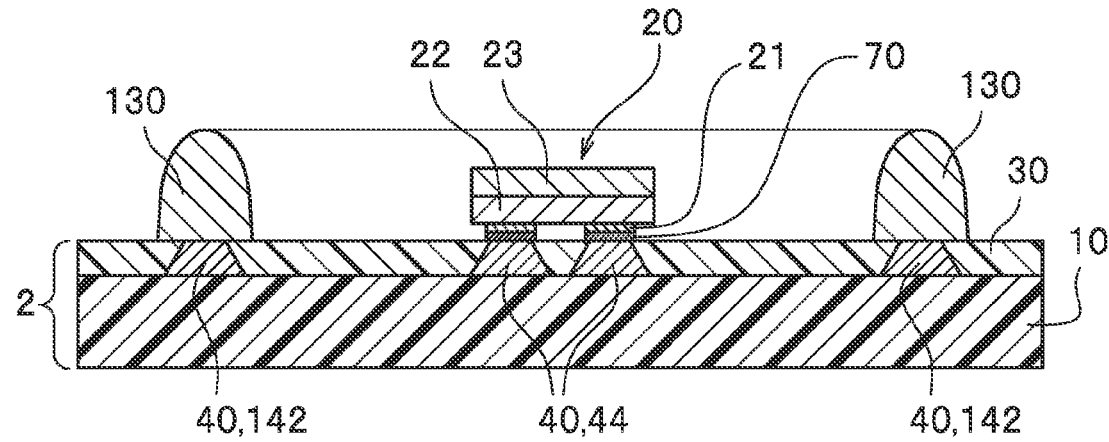
FIG. 9C is a cross-sectional view illustrating the method of manufacturing the light-emitting device according to the first embodiment.
Figure 9D:
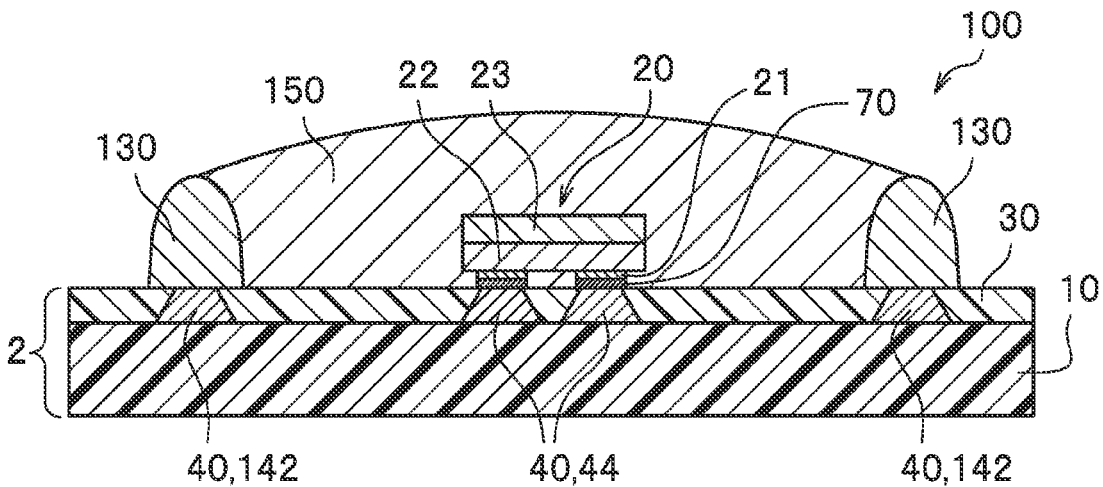
FIG. 9D is a cross-sectional view illustrating the method of manufacturing the light-emitting device according to the first embodiment.

FIG. 8 is a flowchart showing the method of manufacturing the light-emitting device 100. FIG. 9A is a cross-sectional view illustrating the wiring substrate 2 in the method of manufacturing the light-emitting device 100. FIG. 9B is a cross-sectional view illustrating a state in which the light source 20 is disposed. FIG. 9C is a cross-sectional view illustrating a state in which the frame member 130 is formed. FIG. 9D is a cross-sectional view illustrating a state in which the sealing member 150 is disposed.

The method of manufacturing the light-emitting device 100 includes a step S21 of manufacturing the wiring substrate 2 by the method of manufacturing the wiring substrate according to the embodiment, and a step S22 of disposing the light source 20 including the light-emitting element 22 over the wiring substrate 2 and electrically connecting the light-emitting element 22 and the wiring substrate 2 by the conductive connection member 70. Here, the method of manufacturing the light-emitting device 100 further includes a step S23 of forming the frame member 130 and a step S24 of disposing the sealing member 150.

Manufacturing Wiring Substrate

In the step S21 of manufacturing the wiring substrate, the wiring substrate 2 is manufactured by the above-described method of manufacturing a wiring substrate. The material of the base body 10 may be a ceramic. The resist portion 30 and the wiring line 40 are formed only on the first surface 10A as the upper surface of the base body 10.

In the wiring line 40, the external electrodes 141 having a rectangular shape, the internal electrodes 142 having a semicircular arc shape, and the light source electrodes 143 are formed such that the corresponding positive and negative electrodes are continuous on the upper surface side of the wiring substrate 2. Here, each of the light source electrodes 143 is formed by connecting, on the upper surface side, each of two pairs of the four pad portions 44 having a square shape.

Electrically Connecting Light-emitting Element and Wiring Substrate by Conductive Connection Member In the step S22 of electrically connecting the light-emitting element and the wiring substrate by the conductive connection member, the light source 20 is disposed over the upper surface of the wiring substrate 2. The element electrodes 21 of the light source 20 are bonded to the pad portions 44 of the light source electrodes 143 via the conductive connection member 70, and the light-emitting element 22 and the wiring substrate 2 are electrically connected by the conductive connection member 70. As an example, a case in which solder in the form of a paste is used as the conductive connection member 70 will be described. First, the solder in the form of the paste is applied to the pad portions 44 by screen printing or the like. Subsequently, the light source 20 is mounted over the wiring substrate 2 such that the element electrodes 21 face the pad portions 44. At this time, each of the element electrodes 21 encloses two of the pad portions 44 in a plan view. The element electrodes 21 can be bonded to the pad portions 44 by a reflow method.

Forming Frame Member

In the step S23 of forming the frame member, the frame member 130 is formed to surround the light source 20 so as to be spaced apart from the light source 20. For example, the frame member 130 can be formed by applying a material of the frame member 130 having fluidity before being cured or solidified and curing or solidifying the material.

The material having fluidity can be applied so as to surround a periphery of the internal electrodes 142 while being discharged from a dispenser nozzle, for example. After the applied material is cured or solidified, the frame member 130 is applied such that the frame member 130 has a larger width than the internal electrode 142 and a higher height than the light source 20.

A material that is cured by heating, irradiation with ultraviolet light, or the like can be used as a resin. When a ceramic is heated and solidified under pressure, internal voids can be reduced and the light reflectance can be improved.

Disposing Sealing Member

In the step S24 of disposing the sealing member, the sealing member 150 is disposed in an interior region surrounded by the frame member 130. For example, the sealing member 150 is disposed by filling an interior region surrounded by the frame member 130 with a thermosetting resin having fluidity in an uncured state and curing the thermosetting resin. The thermosetting resin may contain a wavelength conversion substance or a light-diffusing material.

The sealing member 150 is disposed so as to cover the upper surface of the wiring substrate 2, the light source 20, and an inner lateral surface of the frame member 130. The sealing member 150 is preferably formed such that a central portion thereof is higher than a peripheral edge portion.

Light-Emitting Device (Second Embodiment)

Subsequently, a light-emitting device 200 according to a second embodiment will be described with reference to FIGS. 10A to 10D.

Figure 10A:
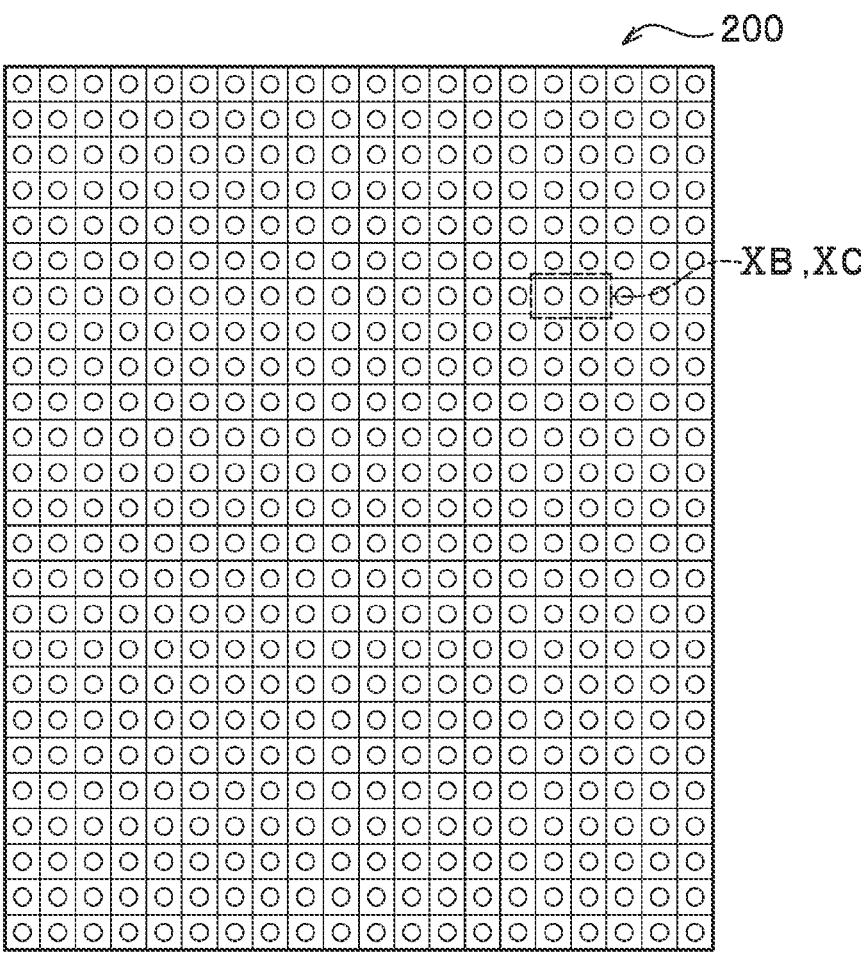
FIG. 10A is a plan view illustrating a light-emitting device according to a second embodiment.
Figure 10B:
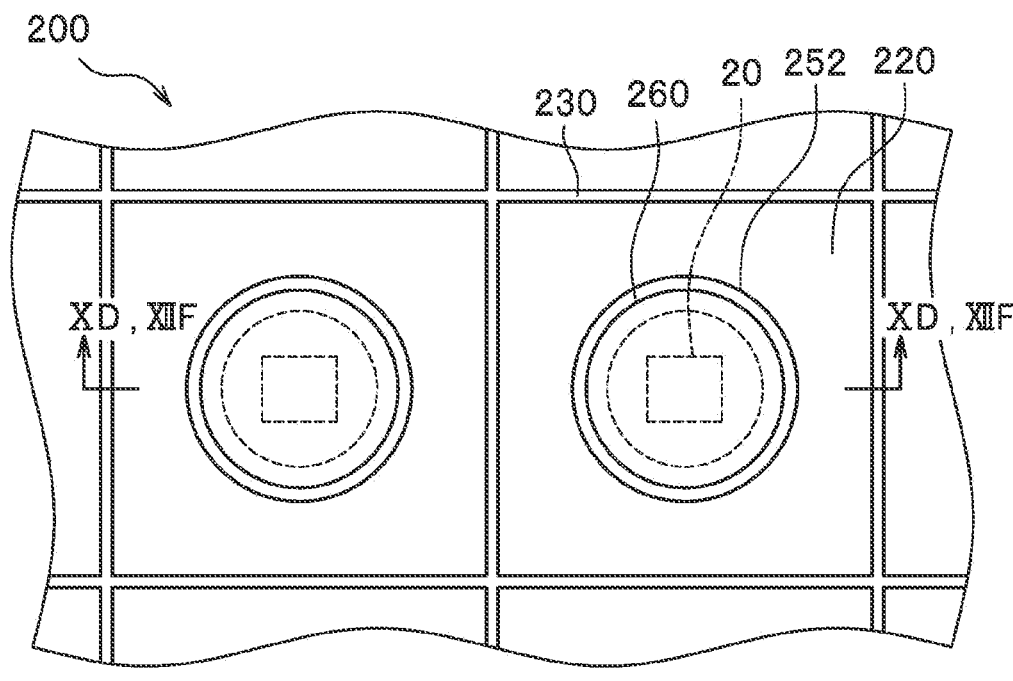
FIG. 10B is a plan view illustrating part of the light-emitting device according to the second embodiment.
Figure 10C:
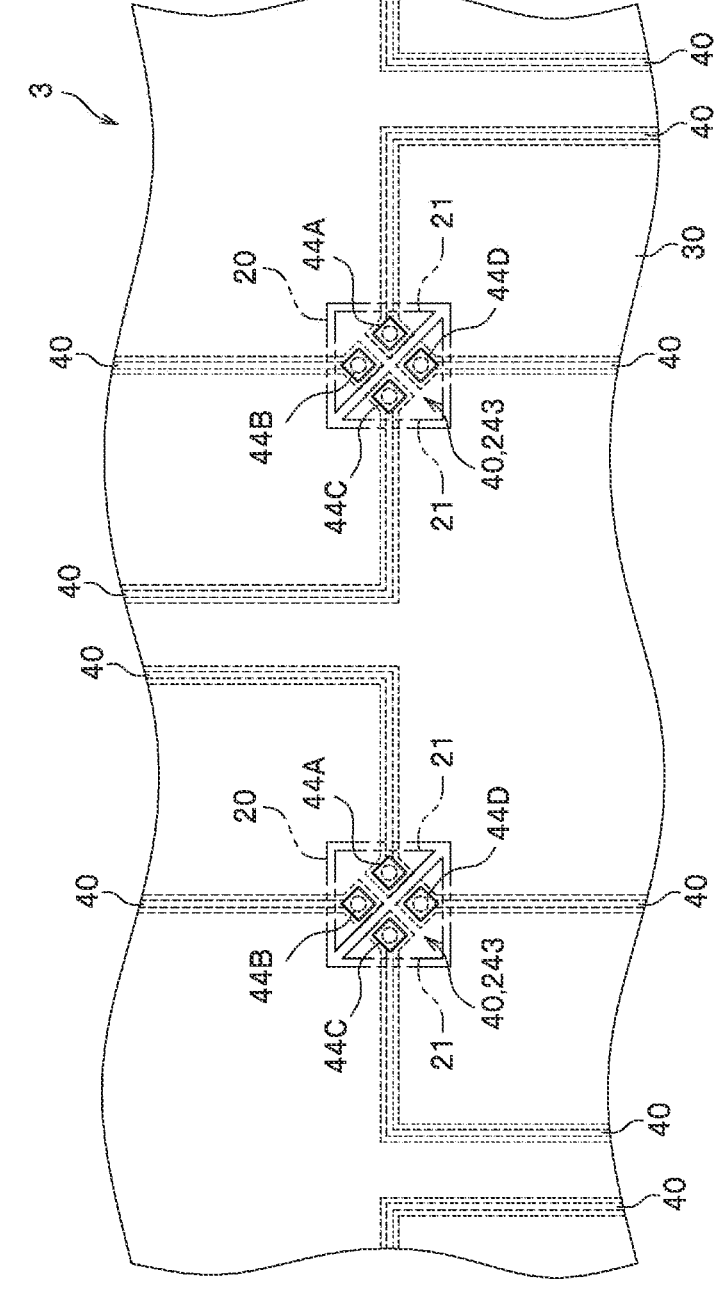
FIG. 10C is a plan view illustrating a part corresponding to FIG. 10B in a wiring substrate of the light-emitting device according to the second embodiment.
Figure 10D:
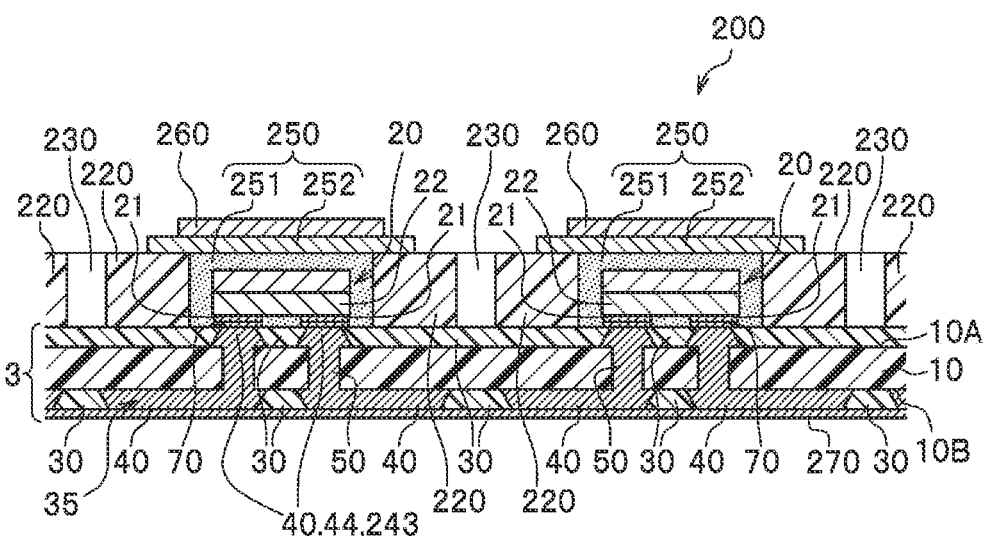
FIG. 10D is a cross-sectional view taken along line XD-XD in FIG. 10B.

FIG. 10A is a plan view illustrating the light-emitting device 200. FIG. 10B is a plan view illustrating part of the light-emitting device 200. FIG. 10C is a plan view illustrating a part corresponding to FIG. 10B in a wiring substrate 3 of the light-emitting device 200. FIG. 10D is a cross-sectional view taken along line XD-XD in FIG. 10B.

The light-emitting device 200 includes the wiring substrate 3 according to the embodiment, and the light sources 20 disposed over the wiring substrate 3 and each including the light-emitting element 22. The light-emitting element 22 includes the pair of element electrodes 21. The light sources 20 are aligned in a row direction and a column direction over one surface of the wiring substrate 3. The light-emitting device 200 further includes a partition groove 230 that partitions and surrounds a predetermined number of the light sources 20, and a light guide member 220 that guides light of the corresponding light source 20 to an interior region surrounded by the partition groove 230. However, a member having light reflectivity may be provided in the partition groove 230. Here, the wiring line 40 is disposed on the other surface side of the wiring substrate 3, while leaving the pad portions 44 facing the corresponding element electrodes 21. The pad portions 44 are connected to the remaining part of the wiring line 40 via the via conduction portions 50 provided at the positions of the pad portions 44 and penetrating the base body 10 so as to electrically connect the pad portions 44 to the wiring line 40. The resist portion 30 is disposed between the adjacent pad portions 44. The light-emitting device 200 further includes light-transmissive members 250 each including a first light-transmissive portion 251 in contact with the corresponding light source 20 and a second light-transmissive portion 252 positioned above the light source 20 and the first light-transmissive portion 251, and light adjustment members 260 disposed above the light sources 20, the first light-transmissive portions 251, and the second light-transmissive portions 252. The light guide members 220 are disposed above one surface of the wiring substrate 3 and lateral to the light sources 20.

The light-emitting device 200 is a planar light-emitting device in which a large number of the light sources 20 are aligned in the row direction and the column direction over the wiring substrate 3. Components of the light-emitting device 200 will be described below.

Wiring Substrate

In the wiring substrate 3, similarly to the wiring substrate 1, the wiring line 40 is disposed in the hole portion 35 of the resist portion 30 so as to be in contact with the base body 10, and in a cross-sectional view in the thickness direction of the base body 10, the length of the exposed surface 48 of the wiring line 40 exposed from the resist portion 30 is less than the length of the contact surface 46 of the wiring line 40 in contact with the base body 10. Furthermore, the resist portion 30 and the wiring line 40 are formed on the first surface 10A and the second surface 10B of the base body 10, and the via conduction portion 50 is provided. For example, the wiring substrate 3 has a rectangular shape, and the light sources 20 are disposed over the first surface 10A. Hereinafter, the first surface 10A side is referred to as an upper surface and the second surface 10B side is referred to as a lower surface.

The wiring substrate 3 includes, at an end portion thereof or the like, an external terminal to which an external power source or the like is connected. The wiring line 40 extends from the external terminal to positions of the light sources 20 and includes light source electrodes 243 for disposing the light sources 20. Here, each of the light source electrodes 243 includes the four pad portions 44A, 44B, 44C, and 44D (which may be collectively referred to as pad portions 44) each having a square shape. The wiring line 40 is disposed on a lower surface side of the wiring substrate 3, while leaving the pad portions 44 facing the corresponding element electrodes 21. The pad portions 44 are connected to the wiring line 40 on the lower surface side, via the via conduction portions 50 provided at the positions of the pad portions 44. The resist portion 30 is disposed between the adjacent pad portions 44.

The pad portions 44A and 44B face one of the pair of element electrodes 21, and the pad portions 44C and 44D face the other of the pair of element electrodes 21. A lower surface of the light source 20 faces the resist portion 30, between the pair of element electrodes 21. The pad portions 44A and 44B are connected to each other on the lower surface side of the wiring substrate 3, and the pad portions 44C and 44D are connected to each other on the lower surface side of the wiring substrate 3.

A covering member 270 having an insulating property is formed on the lower surface of the wiring substrate 3. For example, a silicone resin, an epoxy resin, or the like can used as the material of the covering member 270. The covering member 270 can protect the lower surface of the wiring substrate 3.

Light Source

The light source 20 may be the same as or different from the light source 20 of the light-emitting device 100. For example, the light source 20 may include only a light-emitting element. However, it is also possible to use a light source in which only a phosphor or a resin member containing a phosphor or the like is disposed on a light-emitting element, or such a light source in which a reflective member is fixed to a lateral surface of a light-emitting element. In the light-emitting device 200, the light sources 20 are aligned in the row direction and the column direction.

Partition Groove

Each of the partition grooves 230 is a groove that partitions and surrounds a predetermined number of the light sources 20. Here, the partition grooves 230 are provided in a rectangular lattice shape, and partition and surround the light sources 20 one by one. The light-emitting device 200 can control brightness and an on/off operation in units of partitioned sections each surrounded by the partition grooves 230.

The partition grooves 230 may be filled with a member having light reflectivity. The material of the member that fills the partition grooves 230 may be, for example, a material in which a light-diffusing material such as titanium oxide, silicon oxide, or aluminum oxide is contained in a resin such as acrylic, polycarbonate, silicone, or epoxy.

Light Guide Member

The light guide member 220 is a member that guides light from the light source 20 to the outside. The light guide member 220 is disposed in an internal region surrounded by the partition groove 230 and lateral to the light source 20.

For example, the light guide member 220 is a plate-shaped or sheet-shaped member having transmissivity, and includes, at the position of the light source 20, a through hole having a size large enough that the light source 20 can be disposed therein. The through hole is large enough to surround the light source 20 such that the light source 20 and the light guide member 220 are spaced apart from each other. Here, the thickness of the light guide member 220 is greater than the height from the upper surface of the wiring substrate 3 to the upper surface of the light source 20.

Examples of the material that can be used for the light guide member 220 include a thermoplastic resin such as acrylic, polycarbonate, cyclic polyolefin, polyethylene terephthalate, or polyester, and a material having transmissivity such as glass. In particular, it is preferable to use polycarbonate, which has high transparency and is inexpensive.

Light-Transmissive Member

The light-transmissive member 250 is a member having transmissivity and disposed above and lateral to the light source 20. Here, the light-transmissive member 250 includes the first light-transmissive portion 251 in contact with the light source 20 and the second light-transmissive portion 252 positioned above the light source 20 and the first light-transmissive portion 251.

The first light-transmissive portion 251 is disposed lateral to the light source 20, and is in contact with a lateral surface of the light source 20 and an inner lateral surface of the light guide member 220. The first light-transmissive portion 251 may be disposed below the light source 20, and is in contact with the lower surface of the light source 20 and the upper surface of the resist portion 30. The first light-transmissive portion 251 is disposed above the light source 20 and is in contact with the upper surface of the light source 20.

The material of the first light-transmissive portion 251 is not limited as long as the material is a transparent resin; however, it is preferable to use a thermosetting resin such as an epoxy resin, a silicone resin, or an acrylic resin.

The second light-transmissive portion 252 is in contact with the upper surface of the first light-transmissive portion 251 and the upper surface of the light guide member 220. The second light-transmissive portion 252 may have a shape and a size that allow it to enclose the first light-transmissive portion 251 in a plan view, and here, the second light-transmissive portion 252 has a circular shape.

A material similar to that of the first light-transmissive portion 251 can be used as the material of the second light-transmissive portion 252. The light-transmissive member 250 or the first light-transmissive portion 251 may contain one type of phosphor or a plurality of types of phosphors.

Furthermore, the following structure may be employed: the first light-transmissive portion 251 is disposed only on part of the upper surface of the light source 20 or is not disposed on the upper surface of the light source 20, and the second light-transmissive portion 252 is in contact with part of or the entire upper surface of the light source 20.

Light Adjustment Member

The light adjustment member 260 is a sheet-shaped or plate-shaped member that reflects, above the light source 20, part of the light from the light source 20. The light adjustment member 260 is disposed above the light source 20. When the first light-transmissive portion 251 and the second light-transmissive portion 252 are provided, the light adjustment member 260 is disposed above the first light-transmissive portion 251 and the second light-transmissive portion 252. The light adjustment member 260 is disposed on the upper surface of the second light-transmissive portion 252, but may extend to the upper surface of the light guide member 220.

The light adjustment member 260 is disposed at a position overlapping the light source 20 in a plan view, and is formed in a shape and a size that allow it to enclose the light source 20. Here, the light adjustment member 260 has a circular shape, but the light adjustment member 260 may have a rectangular shape or the like.

The light transmittance of the light adjustment member 260 is preferably in a range from 20% to 60%, more preferably in a range from 30% to 40%, with respect to the light of the light source 20. A material used for the light adjustment member 260 may be, for example, a resin material containing a light-diffusing material, or a metal material. For example, the resin material may be a polyethylene terephthalate resin, a silicone resin, an epoxy resin, or a resin obtained by mixing these resins. Examples of the light-diffusing material include well-known materials such as titanium oxide, silicon oxide, aluminum oxide, and zinc oxide, and glass. The light adjustment member 260 may contain bubbles of air or the like.

In the light-emitting device 200, the wiring line 40 is disposed on the other surface side of the wiring substrate 3, while leaving the pad portions 44 facing the corresponding element electrodes 21. The resist portion 30 is formed on the surface of the wiring substrate 3 over which the light sources 20 are disposed, except for the pad portions 44. Thus, in the light-emitting device 200, it is possible to suppress absorption of light by the wiring line 40, increase the light reflectance of the resist portion 30 and the area thereof, and effectively utilize the light from the light sources 20.

The width of the partition groove 230 may be different between a lower end side and an upper end side. A lateral surface of the light guide member 220 in the partition groove 230 may be inclined but need not be inclined. The partition groove 230 may be formed such that part of the light guide member 220 is continuous on the wiring substrate 3 side. The light that is guided between adjacent partitioned sections can be adjusted by the depth and the shape of the partition groove 230.

The partition groove 230 may partition and surround a plurality of the light sources 20. For example, the partition groove 230 may partition and surround four of the light sources 20 arranged in two rows and two columns or nine of the light sources 20 arranged in three rows and three columns.

Method of Manufacturing Light-Emitting Device
(Second Embodiment)

Subsequently, a method of manufacturing the light-emitting device 200 according to the second embodiment will be described with reference to FIGS. 11 to 12F.

Figure 11:
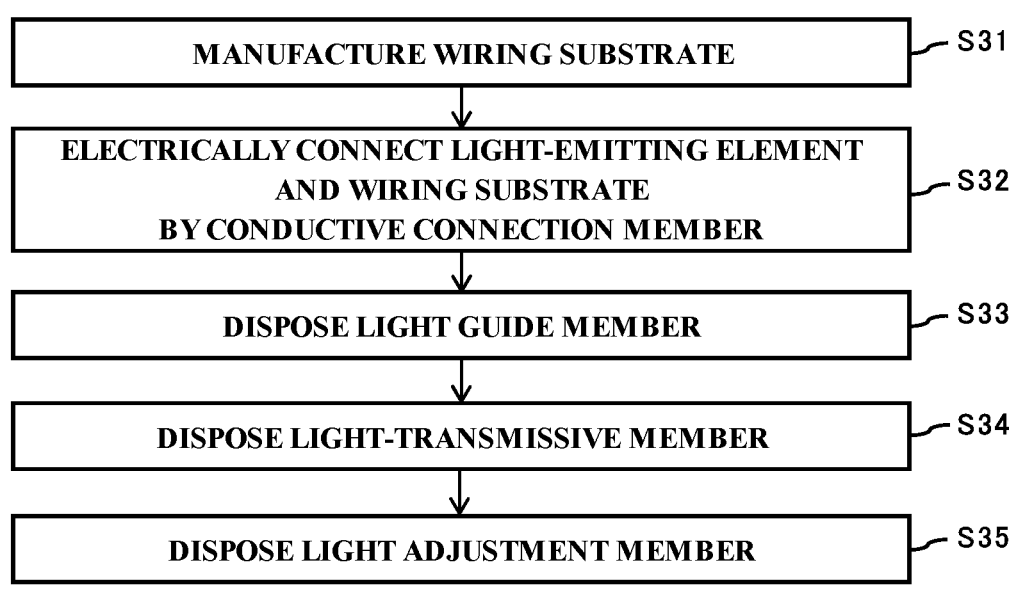
FIG. 11 is a flowchart showing a method of manufacturing the light-emitting device according to the second embodiment.
Figure 12A:
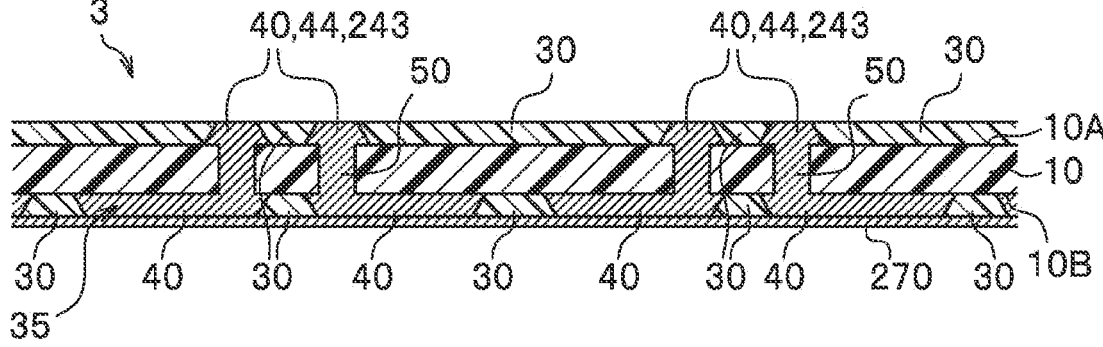
FIG. 12A is a cross-sectional view illustrating the method of manufacturing the light-emitting device according to the second embodiment.
Figure 12B:
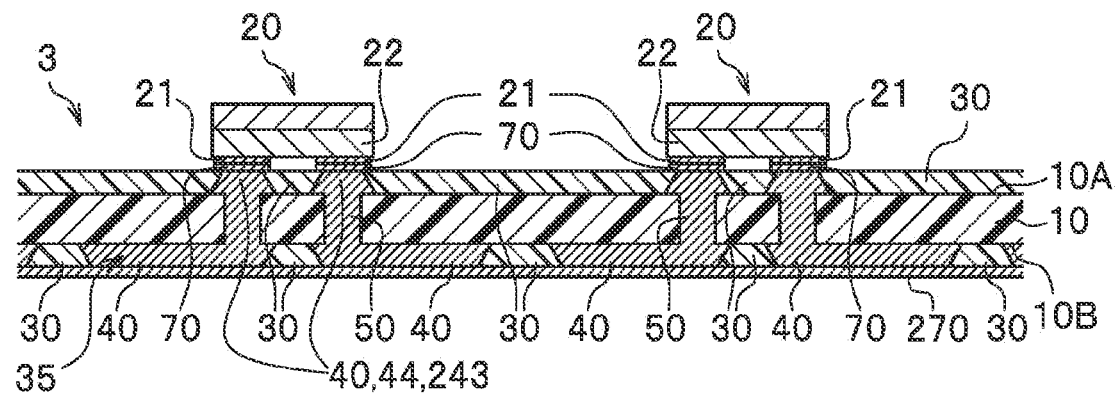
FIG. 12B is a cross-sectional view illustrating the method of manufacturing the light-emitting device according to the second embodiment.
Figure 12C:
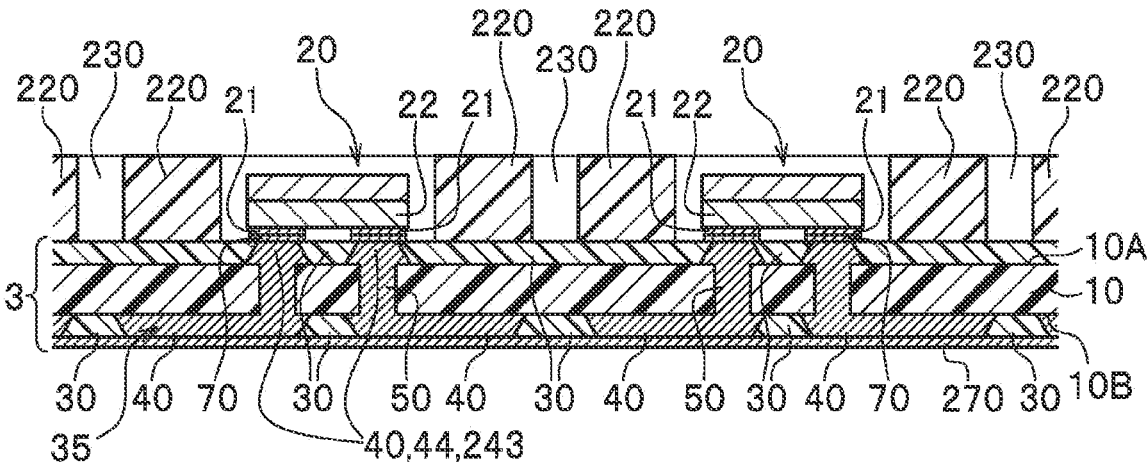
FIG. 12C is a cross-sectional view illustrating the method of manufacturing the light-emitting device according to the second embodiment.
Figure 12D:
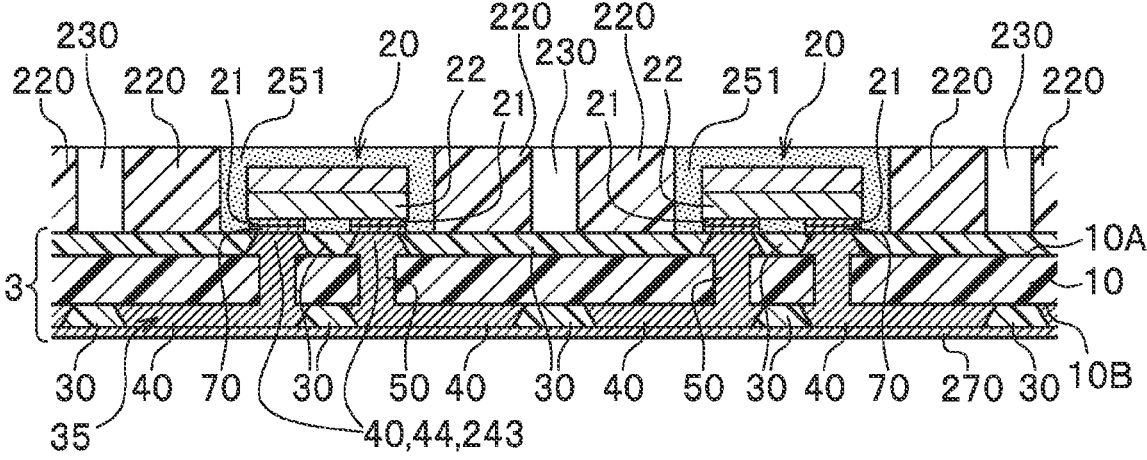
FIG. 12D is a cross-sectional view illustrating the method of manufacturing the light-emitting device according to the second embodiment.
Figure 12E:
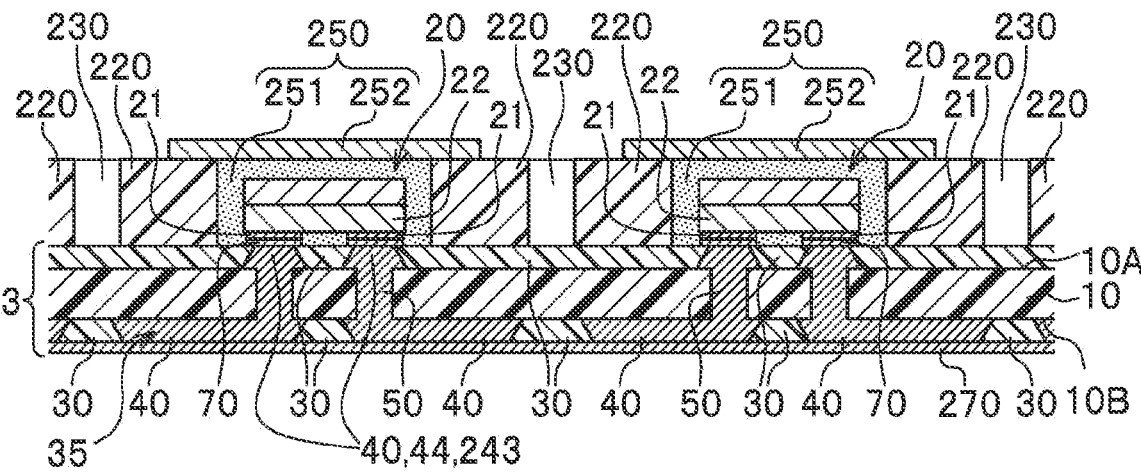
FIG. 12E is a cross-sectional view illustrating the method of manufacturing the light-emitting device according to the second embodiment.
Figure 12F:
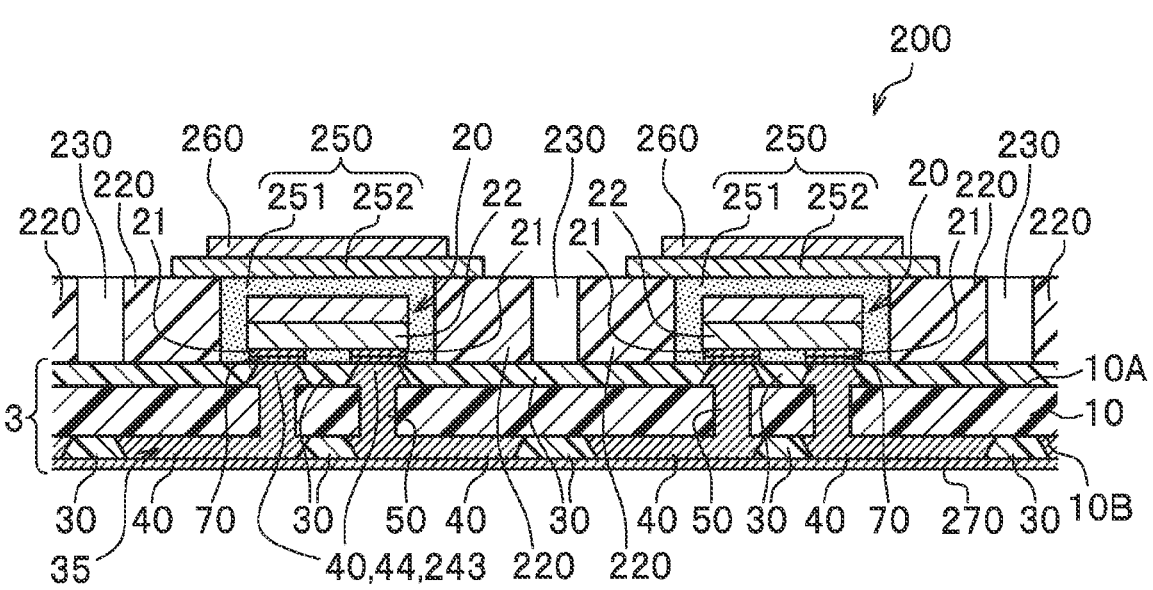
FIG. 12F is a cross-sectional view illustrating the method of manufacturing the light-emitting device according to the second embodiment.

FIG. 11 is a flowchart showing the method of manufacturing the light-emitting device 200. FIG. 12A is a cross-sectional view illustrating the wiring substrate 3 in the method of manufacturing the light-emitting device 200. FIG. 12B is a cross-sectional view illustrating a state in which the light sources 20 are provided. FIG. 12C is a cross-sectional view illustrating a state in which the light guide members 220 are provided. FIG. 12D is a cross-sectional view illustrating a state in which the first light-transmissive portions 251 are provided. FIG. 12E is a cross-sectional view illustrating a state in which the second light-transmissive portions 252 are provided. FIG. 12F is a cross-sectional view illustrating a state in which the light adjustment members 260 are provided.

The method of manufacturing the light-emitting device 200 includes a step S31 of manufacturing the wiring substrate 3 by the method of manufacturing a wiring substrate according to the embodiment, and a step S32 of electrically connecting the light-emitting element 22 and the wiring substrate 3 by the conductive connection member 70 after disposing the light sources 20 each including the light-emitting element 22 over the wiring substrate 3. In the step S32 of electrically connecting the light-emitting element and the wiring substrate by the conductive connection member, the light sources 20 are aligned in the row direction and the column direction on one surface of the wiring substrate 3. The method of manufacturing the light-emitting device 200 further includes a step S33 of disposing the light guide members 220 that guide the light of the light sources 20 such that the partition grooves 230 each partitioning and surrounding a predetermined number of the light sources 20 are formed. Furthermore, in S33 of disposing the light guide members, the light guide members 220 are disposed above one surface of the wiring substrate 3 and lateral to the light sources 20, and the method of manufacturing the light-emitting device 200 further includes a step S34 of disposing the light-transmissive members 250 each including the first light-transmissive portion 251 in contact with the corresponding light source 20 and the corresponding second light-transmissive portion 252 above the light source 20 and the first light-transmissive portion 251, and S35 of disposing the light adjustment members 260 above the light sources 20, the first light-transmissive portions 251, and the second light-transmissive portions 252.

Manufacturing Wiring Substrate

In the step S31 of manufacturing the wiring substrate, the wiring substrate 3 is manufactured by the above-described method of manufacturing a wiring substrate. The resist portions 30 and the wiring line 40 are formed on the first surface 10A and the second surface 10B of the base body 10.

In the wiring line 40, the light source electrodes 243 are formed at positions where the light sources 20 are disposed on the upper surface side of the wiring substrate 3. Here, each of the light source electrodes 243 is formed of the four pad portions 44 having a square shape. The resist portion 30 is formed between the adjacent pad portions 44. The remaining part of the wiring line 40 other than the pad portions 44 can be formed on a lower surface side. Each of the pad portions 44 is connected to the wiring line 40 on the lower surface side via the via conduction portion 50 provided at the position of the pad portion 44.

After the step S14 of polishing and grinding the resist portion 30 and the wiring line 40, the covering member 270 having an insulating property is formed on the lower surface side. For example, the covering member 270 can be formed by applying and curing an uncured material of the covering member 270.

Electrically Connecting Light-Emitting Element and Wiring Substrate by Conductive Connection Member In the step S32 of electrically connecting the light-emitting element and the wiring substrate by the conductive connection member, the light sources 20 are disposed on the upper surface of the wiring substrate 3. The light sources 20 are aligned in the row direction and the column direction on the upper surface of the wiring substrate 3. As in the method of manufacturing the light-emitting device 100, the element electrodes 21 of each of the light sources 20 are bonded to the pad portions 44 of the light source electrode 243 via the conductive connection member 70, and the light-emitting elements 22 and the wiring substrate 3 are electrically connected by the conductive connection member 70.

Disposing Light Guide Member

In the step S33 of disposing the light guide member, the light guide members 220 are disposed on a surface of the wiring substrate 3 over which the light sources 20 are disposed.

Here, the light guide members 220 are formed in advance, and each of the light guide members 220 includes a through hole having a size at which the corresponding light source 20 can be surrounded while being spaced apart from the light guide member 220. The light guide member 220 is disposed such that the light source 20 is located at a center of the through hole. The light guide member 220 can be fixed to the wiring substrate 3 via an adhesive having transmissivity, for example. For example, the light guide members 220 are formed separately for respective light sources 20. Thus, the partition groove 230 can be formed between the adjacent light guide members 220.

Disposing Light-Transmissive Member

In the step S34 of disposing the light-transmissive members, the light-transmissive members 250 are disposed above and lateral to the light sources 20. Each of the light-transmissive members 250 includes the first light-transmissive portion 251 and the second light-transmissive portion 252. Here, the first light-transmissive portion 251 is disposed in contact with the upper surface, the lateral surface, and the lower surface of the corresponding light source 20. The second light-transmissive portion 252 is disposed in contact with the upper surface of the first light-transmissive portion 251 and the upper surface of the light guide member 220.

The first light-transmissive portion 251 can be disposed by filling, with an uncured material having fluidity, a region between the light source 20 and the light guide member 220 over the upper surface of the wiring substrate 3 and curing the material. Here, the first light-transmissive portion 251 is disposed to have a height high enough to cover the upper surface of the light source 20.

The second light-transmissive portion 252 can be disposed by applying, to the upper surface of the first light-transmissive portion 251, an uncured material having fluidity and curing the material. Here, the second light-transmissive portion 252 is disposed in contact with part of the upper surface of the light guide member 220.

Filling or application for formation of the first light-transmissive portion 251 and the second light-transmissive portion 252 may be performed by a method such as potting, spraying, ink jetting, or printing. The second light-transmissive portion 252 may be formed by disposing, on the first light-transmissive portion 251, a member formed in a sheet shape or a plate shape.

Disposing Light Adjustment Member

In S35 of disposing the light adjustment member, the light adjustment members 260 are disposed on the light-transmissive members 250 above the light sources 20. The light adjustment member 260 is disposed at a position overlapping the light source 20 and the light-transmissive member 250 in a plan view. Here, the light adjustment member 260 is disposed on the upper surface of the second light-transmissive portion 252 in a shape and a size that allow the light adjustment member 260 to enclose the upper surface of the first light-transmissive portion 251 in a plan view.

The light adjustment member 260 may be formed by applying an uncured material of the light adjustment member 260 on the second light-transmissive portion 252 and curing the uncured material, or may be formed by disposing a member formed in a sheet shape or a plate shape. Here, for example, a silicone resin containing titanium oxide is applied and cured.

The first light-transmissive portion 251 may be cured simultaneously with the second light-transmissive portion 252, after the second light-transmissive portion 252 is applied. Furthermore, after the light adjustment member 260 is applied, the first light-transmissive portion 251 and the second light-transmissive portion 252 may be cured simultaneously with the light adjustment member 260.

The wiring substrate, the light-emitting device, and the manufacturing methods of the wiring substrate and the light-emitting device according to the embodiments of the present disclosure can be used for a lighting light source such as a COB type light-emitting light source, a backlight light source of a liquid crystal display, various types of lighting equipment, a display for indoor use or outdoor use, various types of display devices for advertisements and destination information, and can be utilized in a vehicle and the like.

The invention claimed is:

1. A wiring substrate comprising:
   a base body having an insulating property and including a first surface and a second surface on a side opposite the first surface;

a resist portion covering at least part of the first surface and at least a part of the second surface of the base body and including a hole portion having a predetermined pattern; and a wiring line disposed in the hole portion of the resist portion so as to be in contact with the base body; wherein:

in a cross-sectional view in a thickness direction of the base body, a length of an exposed surface of the wiring line exposed from the resist portion is less than a length of a contact surface of the wiring line in contact with the base body; and the wiring line has a volume resistivity of 10 μΩ·cm or less.

2. The wiring substrate according to claim 1, wherein the hole portion and the wiring line each have a trapezoidal shape in a cross-sectional view in the thickness direction of the base body, and a base angle of the trapezoidal shape is in a range from 40 degrees to 80 degrees.

3. The wiring substrate according to claim 1, wherein the hole portion and the wiring line each have an isosceles trapezoidal shape in a cross-sectional view in the thickness direction of the base body.

4. The wiring substrate according to claim 1, wherein a thickness of the resist portion is in a range from 5 μm to 50 μm.

5. The wiring substrate according to claim 1, wherein the exposed surface of the wiring line and a surface of the resist portion form a flat surface parallel to a surface of the base body.

6. The wiring substrate according to claim 1, wherein the wiring line is formed of a sintered compact of metal particles.

7. The wiring substrate according to claim 1, wherein the resist portion is white.

8. The wiring substrate according to claim 1, wherein the wiring line contains a plurality of bubbles, each having a diameter of 5 μm or less.

9. A light-emitting device comprising:

a wiring substrate comprising:

a base body having an insulating property and including a first surface and a second surface on a side opposite the first surface;

a resist portion covering at least part of the first surface and at least a part of the second surface of the base body and including a hole portion having a predetermined pattern; and a wiring line disposed in the hole portion of the resist portion so as to be in contact with the base body, wherein:

in a cross-sectional view in a thickness direction of the base body, a length of an exposed surface of the wiring line exposed from the resist portion is less than a length of a contact surface of the wiring line in contact with the base body;

a plurality of light sources aligned in a row direction and a column direction over a first surface of the wiring substrate, each light source comprising a light-emitting element and disposed over the wiring substrate, each light-emitting element comprising a pair of element electrodes;

a partition groove that partitions and surrounds a predetermined number of the plurality of light sources; and a light guide member that guides light of the light source to an interior region surrounded by the partition groove.

10. The light-emitting device according to claim 9, wherein:

the wiring line is disposed on a second surface side of the wiring substrate;

the wiring substrate comprises pad portions, each facing a corresponding element electrode of the pair of element electrodes;

the pad portions are connected to the wiring line via via conduction portions located at positions of the pad portions and penetrating the base body so as to electrically connect the pad portions to the wiring line; and the resist portion is disposed between adjacent pad portions of the pad portions.

11. The light-emitting device according to claim 10, further comprising:

a light-transmissive member comprising a first light-transmissive portion that is in contact with the light source, and a second light-transmissive portion positioned above the light source and the first light-transmissive portion; and a light adjustment member disposed above the light source, the first light- transmissive portion, and the second light-transmissive portion; wherein:

the light guide member is disposed on an upper side of a first surface of the wiring substrate and lateral to the light source.

12. A wiring substrate comprising:

a base body having an insulating property and including a first surface and a second surface on a side opposite the first surface;

a resist portion covering at least part of the first surface and at least a part of the second surface of the base body and including a hole portion having a predetermined pattern; and a wiring line disposed in the hole portion of the resist portion so as to be in contact with the base body; wherein:

in a cross-sectional view in a thickness direction of the base body, a length of an exposed surface of the wiring line exposed from the resist portion is less than a length of a contact surface of the wiring line in contact with the base body; and the wiring line contains a plurality of bubbles, each having a diameter of 5 um or less.

13. The wiring substrate according to claim 12, wherein the hole portion and the wiring line each have a trapezoidal shape in a cross-sectional view in the thickness direction of the base body, and a base angle of the trapezoidal shape is in a range from 40 degrees to 80 degrees.

14. The wiring substrate according to claim 12, wherein the hole portion and the wiring line each have an isosceles trapezoidal shape in a cross-sectional view in the thickness direction of the base body.

15. The wiring substrate according to claim 12, wherein a thickness of the resist portion is in a range from 5 μm to 50 μm.

16. The wiring substrate according to claim 12, wherein the exposed surface of the wiring line and a surface of the resist portion form a flat surface parallel to a surface of the base body.

17. The wiring substrate according to claim 12, wherein the wiring line is formed of a sintered compact of metal particles.

18. The wiring substrate according to claim 12, wherein the resist portion is white.

* * * * *